US011889671B2

(12) United States Patent
Lhost et al.

(10) Patent No.: US 11,889,671 B2
(45) Date of Patent: Jan. 30, 2024

(54) COMPOSITE MATERIAL WITH EMI SHIELDING PROPERTIES AND PROCESS TO PRODUCE IT

(71) Applicants: TOTALENERGIES ONETECH, Courbevoie (FR); CENTRE NATIONAL DE LA RECHERCHE SCIENTIFIQUE (CNRS), Paris (FR); UNIVERSITÉ CLAUDE BERNARD LYON 1 (UCBL), Villeurbanne (FR)

(72) Inventors: Olivier Lhost, Havre (BE); Yves Trolez, Arquennes (BE); Anatoli Serghei, Villeurbanne (ER); Hubert Lecocq, Villeurbanne (FR); Philippe Cassagnau, Villeurbanne (FR)

(73) Assignees: TOTALENERGIES ONETECH, Courbevoie (FR); CENTRE NATIONAL DE LA RECHERCHE SCIENTIFIQUE (CNRS), Paris (FR); UNIVERSITÉ CLAUDE BERNARD LYON 1 (UCBL), Villeurbanne (FR)

( * ) Notice: Subject to any disclaimer, the term of this patent is extended or adjusted under 35 U.S.C. 154(b) by 0 days.

(21) Appl. No.: 18/031,227

(22) PCT Filed: Oct. 1, 2021

(86) PCT No.: PCT/EP2021/077081
§ 371 (c)(1),
(2) Date: Apr. 11, 2023

(87) PCT Pub. No.: WO2022/084002
PCT Pub. Date: Apr. 28, 2022

(65) Prior Publication Data
US 2023/0276605 A1    Aug. 31, 2023

(30) Foreign Application Priority Data
Oct. 21, 2020   (EP) ...................... 20315437

(51) Int. Cl.
| H05K 9/00 | (2006.01) |
| C08J 3/20 | (2006.01) |
| C08K 5/09 | (2006.01) |
| C08K 5/20 | (2006.01) |
| C08K 9/02 | (2006.01) |

(52) U.S. Cl.
CPC ............ H05K 9/0088 (2013.01); C08J 3/203 (2013.01); C08K 5/09 (2013.01); C08K 5/20 (2013.01); C08K 9/02 (2013.01); H05K 9/009 (2013.01); C08J 2323/06 (2013.01); C08J 2323/12 (2013.01); C08J 2325/06 (2013.01)

(58) Field of Classification Search
None
See application file for complete search history.

(56) References Cited

U.S. PATENT DOCUMENTS

| 2010/0240832 A1 | 9/2010 | Duc et al. |
| 2012/0289656 A1 | 11/2012 | Knoeppel et al. |
| 2014/0093712 A1* | 4/2014 | Tong ........................ C08L 69/00 524/440 |
| 2014/0361223 A1 | 12/2014 | Park et al. |
| 2022/0195163 A1* | 6/2022 | Niessner ................. C08L 23/12 |

FOREIGN PATENT DOCUMENTS

| CN | 107353777 A | 11/2017 |
| CN | 109485990 A | 3/2019 |
| EP | 2401311 A1 | 1/2012 |
| KR | 100862641 B1 | 10/2008 |
| WO | 2012023672 A1 | 2/2012 |
| WO | 2015156137 A1 | 10/2015 |

OTHER PUBLICATIONS

Pye (Polycarbonate—an overview). (Year: 2021).*
International Search Report and Written Opinion issued in Application No. PCT/EP2021/077081, dated Feb. 1, 2022, 9 pages.
G.J. Ray et al., "Carbon-13 Nuclear Magnetic Resonance Determination of Monomer Composition and Sequence Distribution in Ethylene-Propylene Copolymers Prepared with a Stereoregular Catalyst System"; Macromolecules, vol. 10, n° 4, 1977, p. 773-778.
Razavi et al., The Geometry of the Site and its Relevance for Chain Migration and Stereospecificity, Macromol. Symp., vol. 89, pp. 345-367, 1995.

* cited by examiner

*Primary Examiner* — Robert T Butcher
(74) *Attorney, Agent, or Firm* — Ewing & Jones, PLLC

(57) ABSTRACT

The disclosure provides for a composite material suitable for use as EMI shielding material, remarkable in that it comprises a component A being a polymer resin being at least one amorphous polymer resin and/or at least one semi-crystalline polymer resin selected from polyethylene resin and/or polypropylene resin; from 15.0 to 60.0 wt. % of component B being at least one metal-coated particle based on the total weight of the composite material; and from 0.5 to 5.0 wt. % of component C being one or more dispersants based on the total weight of the composite material; wherein one or more dispersants are selected from fatty acids, fatty acid derivatives, ethylene bis stearamide, functionalized waxes, maleic anhydride-grafted polymers and any mixture thereof; wherein the blend of components A, B and C shows a density ranging from 0.8 to 2.0 g/cc. A process to produce such composite material is also described as well as an EMI shield article made from such composite material and the use of such composite material in an EMO shield article.

15 Claims, 8 Drawing Sheets

COMPOSITE MATERIAL WITH EMI SHIELDING PROPERTIES AND PROCESS TO PRODUCE IT

CROSS-REFERENCE TO RELATED APPLICATIONS

This application claims the benefit of PCT/EP2021/077081 filed Oct. 1, 2021, which claims priority from EP 20315437.2 filed Oct. 21, 2020, which are incorporated herein by reference in their entireties for all purposes.

TECHNICAL FIELD

The disclosure relates to composite material suitable as electromagnetic interference (EMI) shielding material, their use and their processes of production.

TECHNICAL BACKGROUND

The development of electronics and remote communication has led to an environment that is more and more polluted with electromagnetic waves.

Electromagnetic interference (EMI) appears on many occasions ranging from false operations of computers to burnout accidents of factories. Many research results show the adverse effects of electromagnetic interference on human bodies so that concerns and interests for health have increased. In this situation, restrictions on electromagnetic interference have been strengthened and measures, therefore, have been prepared.

Since an EMI shielding effect is directly proportional to electroconductivity, metals are generally used currently as most EMI shielding materials.

Metal materials reflect electromagnetic waves, but insulating materials such as plastics and the like allow electromagnetic waves to pass therethrough. EMI shielding has been widely known. When electromagnetic waves reach an electrical conductor, some of them are absorbed and passed through the metal but most of them reflect from the surface of the metal, without entering the metal. The reason is that, when the electromagnetic waves reach the conductor, eddy current is generated in the conductor due to electromagnetic induction, which reflects the electromagnetic waves.

Many attempts have been made to impart electroconductivity to a composite material, which is then used to allow vehicles and various kinds of electric apparatuses, electronic assemblies, or cables to exhibit EMI shielding performance or the like.

This composite material is prepared by generally mixing a conductive additive, such as carbon black, carbon nanotubes, metal powder or fibre, to a polymer. However, to achieve the desired electroconductivity of the composite material it may be necessary to add a considerable amount of the conductive additive.

In the case of a polymer composite using carbon materials such as carbon black, carbon fibre, or the like, a large amount of inorganic material is input, resulting in higher hardness, surface roughness, and deterioration in physical properties of the resin. In practice, it was found that it is difficult to cross a threshold of shielding of 40 dB for a plate of 1 mm of thickness for composite material comprising carbon particles such as carbon nanotubes (CNT).

In case a composite material using metal particles is used, the density of the material obtained is very high resulting in heavy panels and devices which are not suitable for use in the car industry. Indeed, the automobile industry is constantly concerned with reducing the weight of the vehicles produced to limit $CO_2$ emissions during the running of the said vehicles.

CN109485990 discloses a composite material made from, by weight, 5-20 parts of polypropylene, 8-10 parts of light calcium carbonate, 3-12 parts of industrial stearic acid, 3-5 parts of calcium, 1-5 parts of a high-carbon material, 2-3 parts of zinc oxide, and 1-2 parts of an activator. The composite material is said to have improved rigidity and toughness but the document is silent regarding the EMI shielding properties and the density of the material.

KR100862641 discloses a method to prepare an electron wave-shielding composition. The method comprises the steps of (a) dissolving silver ingot into nitric acid and pure water, and adding sodium hydroxide thereto to form an AgOH intermediate solution; (b) adding at least one reducing agent selected from the group consisting of ethylene glycol, glycerin, hydrazine, hydroquinone and ascorbic acid to provide silver powder particles; (c) adding ceramic balls, at least one compound selected from the group consisting of stearic acid, palmitic acid, myristic acid and lauric acid and a water-dispersible polyurethane dispersion to the solution containing the reduced Ag powder, followed by agitation; and (d) adding an acrylic thickener or cellulosic thickener to the mixed solution.

CN107353777 discloses an electromagnetic shielding film coating and a preparation method. The electromagnetic shielding film coating is prepared from the following raw materials in parts by weight: 30 to 80 parts of the resin matrix, 25 to 200 parts of solvent, 2 to 55 parts of release agent, 0.1 to 3 parts of a dispersing agent and 5 to 15 parts of curing agent, wherein the release agent is prepared from at least one of polyvinyl alcohol, silicone oil, silicone grease, liquid paraffin, emulsified paraffin, fluorine compound and stearic acid. The electromagnetic shielding film coating has the advantages of low cost, and high flexibility, adhesion, separability and applicability. This disclosure also relates to the preparation method of the electromagnetic shielding film.

There is, therefore, a need for a composite material having high electroconductivity, high EMI shielding properties, and at the same time a low density. In particular, there is a need for a composite material having high EMI shielding properties, and at the same time a low density and good mechanical properties. Also, there is a need for a composite material having high EMI shielding properties, at the same time a low density and good mechanical properties, and that is cost-effective to produce and/or that shows high EMI shielding properties at high frequencies of at least 1 GHz.

SUMMARY

According to a first aspect, the disclosure provides for a composite material suitable for use as EMI shielding material, remarkable in that it comprises:
  a component A being a polymer resin being at least one amorphous polymer resin and/or at least one semi-crystalline polymer resin selected from polyethylene resin and/or polypropylene resin;
  from 15.0 to 60.0 wt. % of component B being at least one metal-coated particle based on the total weight of the composite material; and
  from 0.5 to 5.0 wt. % of component C being one or more dispersants based on the total weight of the composite material; wherein one or more dispersants are selected from fatty acids, fatty acid derivatives, ethylene bis stearamide, functionalized waxes, maleic anhydride-grafted polymers and any mixture thereof;
wherein the blend of components A, B and C has a density ranging from 0.8 to 2.0 g/cc as determined by ISO 1183.

Surprisingly, it was found that it is possible to achieve good EMI shielding properties combined with a low density by blending a polymer resin with metal-coated particles and one or more dispersants like fatty acids. It was found that the use of one or more dispersants in a composite material comprising metal-coated particles not only lowers the percolation threshold of the metal-coated particles within the composite material but also acts in synergy with the metal-coated particles to improve the EMI shielding properties compared to the same material produced without using dispersants. Without being bound by theory, it is believed that the one or more dispersants like fatty acids act as dispersants but also modify the surface properties of the metal-coated particles. It is believed that the addition of one or more dispersants, such as stearic acid, to the metal-coated particles, modifies their surface properties in the sense that the one or more dispersants like fatty acid react with and cling to the surface of the metal-coated particles. This results in metal-coated particles whose surface changes from hydrophilic to hydrophobic. Thus, the affinity of metal-coated particles covered with one or more dispersants molecules with the hydrophobic polymer matrix is increased. The dispersion of the particles in the polymer matrix is then modified, leading to modifications in the morphology and physical properties of the composite material, observed during the study of the conductivity and the electromagnetic shielding.

The Composite Material

For example, the composite material has a shielding of at least 40 dB as determined using a coaxial measurement cell at a frequency ranging from 0.1 to 100 MHz when moulded to form a plaque having a thickness ranging from 1 to 2 mm; with preference, a shielding of at least 50 dB and/or at a frequency ranging from 0.1 MHz to 20 GHz; preferably from 0.1 MHz to 18 GHz or from 0.1 MHz to 8 GHz or from 1 GHz to 8 GHz.

40 dB is a classic EMI shielding requirement for shielding materials (99.99% for the wave power blocked). The disclosure allows the production of sheets having a material displaying 40 dB shielding at 1 mm thickness; this is advantageous since it can on the one hand give leeway to reduce the material thickness while keeping commercial requirements or, on the other hand, give access to more demanding applications where required shielding is higher than 60 dB.

For example, the composite material or the blend of components A, B and C has a density ranging from 0.8 to 2.0 g/cc as determined with a hydrostatic balance (immersion) according to ISO 1183; for example, a density ranging from 0.8 to 1.8 g/cc; for example, from 0.9 to 1.6 g/cc, for example, from 0.9 to 1.5 g/cc; for example, from 0.9 to 1.4 g/cc; for example, from 1.0 to 1.3 g/cc.

For example, the composite material wherein component A is at least one semi-crystalline polymer resin selected from one or more polypropylene resins, shows a young modulus of at least 500 MPa as determined by dynamic mechanical analysis according to ISO 6721-7 with preference of at least 1000 MPa. For example, the composite material wherein component A is one or more polypropylene resins, shows a young modulus ranging from 500 MPa to 5000 MPa as determined by dynamic mechanical analysis according to ISO 6721-7 preferably from 2000 to 4000 MPa.

For example, the composite material wherein component A is at least one semi-crystalline polymer resin, shows an elongation at break of at least 5% as determined according to ISO 527-1; preferably of at least 8%, more preferably of at least 10%. For example, the composite material wherein component A is at least one semi-crystalline polymer resin, shows an elongation at break ranging from 5% to 25% as determined according to ISO 527-1; preferably from 8% to 20%, more preferably of at least 10% to 18%.

Component a being a Polymer Resin

Component A is a polymer resin which is at least one amorphous polymer resin or at least one semi-crystalline polymer resin selected from polyethylene and/or polypropylene.

For example, component A is present in the composite material at a content ranging from 35 to 80 wt. % based on the total weight of the composite material; for example, from 38 to 78 wt. %; for example, from 40 to 75 wt. %; for example, from 45 to 70 wt. %; for example, from 50 to 65 wt. %.

For example, component A is selected from a virgin polymer resin, a post-consumer polymer resin and/or a blend of a virgin polymer resin and a post-consumer polymer resin.

For example, component A comprises from 5 to 100 wt. % of post-consumer polymer resin based on the total weight of component A; for example, from 20 to 95 wt. %; for example, from to 90 wt. %, for example, from 50 to 85 wt. %; for example, from 60 to 80 wt. %.

In an embodiment, component A is or comprises a semi-crystalline polymer resin being at least one polypropylene resin.

The one or more following features can be used to further define component A being at least one polypropylene resin:
- the at least one polypropylene resin is selected from isotactic polypropylene resin and a syndiotactic polypropylene resin; for example, the at least one polypropylene resin are isotactic polypropylene resins; and/or
- the at least one polypropylene resin is selected from a virgin polypropylene resin, a polypropylene post-consumer resin and a blend of a virgin polypropylene resin and a polypropylene post-consumer resin; and/or
- the at least one polypropylene resin is present in the composite material at a content ranging from 35 to 80 wt. % based on the total weight of the composite material; for example, from 38 to 78 wt. %; for example, from 40 to 75 wt. %; for example, from 45 to 70 wt. %; for example, from 50 to 65 wt. %; and/or
- the at least one polypropylene resin has a melt index MI2 ranging from 4 to 260 g/10 min as determined according to ISO 1133 at 230° C. under a load of 2.16 kg; for example, from to 200 g/10 min; for example, from 6 to 180 g/10 min; for example, from 7 to 160 g/10 min; for example, from 8 to 80 g/10 min; for example, from 4 to 80 g/10 min; and/or
- the at least one polypropylene resin is selected from a propylene homopolymer, a copolymer of propylene with one or more comonomers selected from ethylene and $C_4$-$C_{20}$ alpha-olefins, an heterophasic polypropylene and any mixture thereof; and/or
- the at least one polypropylene resin is or comprises a post-consumer polypropylene resin; wherein the post-consumer polypropylene resin is a blend of recycled polypropylene and at least one recycled polymer different from polypropylene, with the content of the recycled polypropylene is ranging from 75 to 97 wt. % relative to the total weight of the post-consumer polypropylene resin; and/or the at least one polypropylene resin comprises a post-consumer polypropylene resin at a content ranging from 5 to 100 wt. % of polypropylene post-consumer resin based on the total weight of component A; for example, from 20 to 95 wt. %; for example, from 40 to 90 wt. %; for example, from 50 to 85 wt. %; for example, from 60 to 80 wt. %.

For example, at least one polypropylene resin is a heterophasic polypropylene comprising:
i. from 60 to 95 wt. % based on the total weight of the heterophasic polypropylene of a polypropylene-based matrix selected from a homopolymer and/or a copolymer of propylene with one or more comonomers selected from ethylene and $C_4$-$C_{20}$ alpha-olefins, and
ii. from 40 to 5 wt. % based on the total weight of the heterophasic polypropylene of a dispersed ethylene-alpha-olefin copolymer;

for example, the alpha-olefin in the ethylene-alpha-olefin copolymer is selected from the group of alpha-olefins having from 3 to 8 carbon atoms and/or the alpha-olefin in the ethylene-alpha-olefin copolymer is in the range of 25 to 70 wt. % based on the total weight of the ethylene-alpha-olefin copolymer.

In an embodiment, component A is or comprises a semi-crystalline polymer resin being at least one polyethylene resin.

The one or more following features can be used to further define component A being at least one polyethylene resin:
the at least one polyethylene resin has a melt index MI2 ranging from 0.01 to 100 g/10 min as determined according to ISO 1133 at 190° C. under a load of 2.16 kg; preferably from 0.1 to 100 g/10 min and more preferably from 4 to 25 g/10 min; and/or the at least one polyethylene resin has a density ranging from 0.900 g/cm$^3$ to 0.960 g/cm$^3$ as determined according to ISO 1183 at a temperature of 23° C.; and/or the at least one polyethylene resin is selected from a polyethylene homopolymer, a copolymer of ethylene with one or more comonomers selected from $C_3$-$C_{20}$ alpha-olefins and any mixture thereof; and/or the at least one polyethylene resin is present in the composite material at a content ranging from 35 to 80 wt. % based on the total weight of the composite material; for example, from 38 to 78 wt. %; for example, from 40 to 75 wt. %; for example, from 45 to 70 wt. %; for example, from 50 to 65 wt. %; and/or the at least one polyethylene resin is selected from a virgin polyethylene resin, a post-consumer polyethylene resin and a blend of a virgin polyethylene resin and a post-consumer polyethylene resin; and/or the at least one polyethylene resin is or comprises a post-consumer polyethylene resin being a blend of recycled polyethylene and at least one recycled polymer different from polyethylene, wherein the content of the recycled polyethylene is ranging from 75 to 97 wt. % relative to the total weight of the post-consumer polyethylene resin.

In an embodiment, component A is or comprises a semi-crystalline polymer resin being a mixture of at least one polypropylene resin and at least one polyethylene resin.

In an embodiment, component A is or comprises at least one amorphous polymer resin.

The one or more following features can be used to further define component A being at least one amorphous polymer resin:
the at least one amorphous polymer resin has a high load melt flow index HLMI of more than 30 g/10 min according to ISO1133 (21.6 kg-200° C.), preferably more than 40 g/10 min, preferably more than 50 g/10 min; and/or the at least one amorphous polymer resin has an MFI of at least 10 g/10 min as measured at 200° C. under a load of 5 kg according to ISO1133; and/or the at least one amorphous polymer is selected from a virgin amorphous resin, a post-consumer amorphous polymer resin and a blend of a virgin amorphous resin and a post-consumer amorphous polymer resin; and/or the at least one amorphous polymer resin is present in the composite material at a content ranging from 35 to 80 wt. % based on the total weight of the composite material; for example, from 38 to 78 wt. %; for example, from 40 to 75 wt. %; for example, from 45 to 70 wt. %; for example, from 50 to 65 wt. %; and/or the at least one amorphous polymer resin is or comprises a post-consumer amorphous polymer resin; and/or the at least one amorphous polymer resin is selected from polystyrene, acrylonitrile-butadiene-styrene, polycarbonate, styrene-acrylonitrile, poly(methyl methacrylate), poly(vinyl chloride), polybutadiene, polybutylene terephthalate, poly(p-phenylene oxide), polysulfone, polyethersulfone, polyethylenimine, polyphenylsulfone, acrylonitrile styrene acrylate or any combination thereof. For example, component A is a polystyrene selected from polystyrene, modified polystyrene, or a combination of polystyrene and modified polystyrene.

The Component B being Metal-Coated Particles

Component B is at least one metal-coated particle and is present in the composite material in a content ranging from 15.0 to 60.0 wt. % based on the total weight of the composite material.

For example, the composite material comprises from 20.0 to 55.0 wt. % of component B based on the total weight of the composite material; for example, from 22.0 to 50.0 wt. %; for example, from 25.0 to 45.0 wt. %.

For example, component B has a density of less than 4.0 g/cc; for example, less than 3.5 g/cc, for example, less than 3.2 g/cc; for example, less than 3.0 g/cc; for example, less than 2.9 g/cc.

For example, the at least one metal-coated particle of component B is or comprises metal-coated fibres with a length to diameter ratio of at least 5; with preference, the length to diameter ratio is at least 10 and/or the length to diameter ratio is at most 100.

For example, the at least one metal-coated particle of component B is or comprises metal-coated fibres wherein the fibres are selected from glass fibres, carbon fibres, polymer fibres, natural fibres and any mixture thereof; with preference, the at least one metal-coated particle is or comprises metal-coated glass-fibres.

For example, the at least one metal-coated particle of component B is or comprises metal-coated fibres with an average length of at least 100 μm, preferably of at least 150 μm, such as an average length ranging from 100 μm to 500 μm; for example, ranging from 150 to 400 μm.

For example, the at least one metal-coated particle of component B is or comprises metal-coated fibres with an average diameter of at least 5 µm; preferably at least 10 µm; such as an average diameter ranging from 5 to 50 µm; for example, from 10 to 40 µm.

For example, the metal of the metal-coated particles is selected from silver, copper, gold, aluminium, tungsten, zinc, cobalt, nickel, iron, titanium, platinum, or any mixture thereof; with preference from silver, copper, gold, aluminium, tungsten, zinc, cobalt, nickel, iron; more preferably, the metal is silver.

For example, the metal-coated particles comprise from 1 to 50 wt. % of metal based on the total weight of the metal-coated particles, preferably from 5 to 30 wt. % or from 6 to 25 wt. %.

The Component C being One or More Dispersants

According to the disclosure, one or more dispersants are selected from fatty acids, fatty acid derivatives, ethylene bis stearamide, functionalized waxes, maleic anhydride-grafted polymers and any mixture thereof. For example, the one or more dispersants are selected from fatty acids, fatty acid derivatives, ethylene bis stearamide, functionalized waxes and any mixture thereof.

The one or more dispersants is present in the composite material in a content ranging from 0.5 to 5.0 wt. % based on the total weight of the composite material.

For example, the composite material comprises from 1.0 to 4.5 wt. % of component C based on the total weight of the composite material; for example, from 1.2 to 3.5 wt. %; for example, from 1.5 to 3.0 wt. %; for example, from 1.8 to 2.8 wt. %.

For example, the one or more dispersants are or comprise fatty acids being saturated fatty acids and/or unsaturated fatty acids. For example, the one or more dispersants are or comprise saturated fatty acids. For example, one or more dispersants are or comprise at least one fatty acid selected from stearic acid, palmitic acid, myristic acid, lauric acid, oleic acid, arachidic acid, erucic acid; behenic acid and any mixture thereof.

For example, the one or more dispersants are or comprise fatty acids having a number of carbon atoms ranging from 6 to 24, preferably from 12 to 22.

For example, the one or more dispersants is or comprises stearic acid. For example, the one or more dispersants are or comprise ethylene bis stearamide. For example, one or more dispersants are or comprise at least ethylene bis stearamide (EBS-CAS Registry Number: 110-30-5) and/or its derivatives. For example, component C is or comprises stearic acid and/or ethylene bis stearamide.

For example, one or more dispersants are or comprise at least one fatty acid derivative selected from a salt of fatty acid, an ester of fatty acid, a carboxylate of fatty acid and any mixture thereof.

For example, one or more dispersants are or comprise at least one fatty acid derivative selected from methyl stearate, lithium stearate, sodium stearate, magnesium stearate, calcium stearate, barium stearate, zinc stearate, aluminium stearate and any mixture thereof.

For example, one or more dispersants are or comprise at least one fatty acid derivative being glycerol monostearate.

For example, one or more dispersants are or comprise at least one functionalized wax selected from functionalized paraffin wax, functionalized polyethylene wax, functionalized polypropylene wax and mixtures thereof.

For example, one or more dispersants are or comprise at least one maleic anhydride-grafted polymers selected from Polyethylene-graft-maleic anhydride (PE-g-MA), Polypropylene-graft-maleic anhydride (PP-g-MA), Styrene-Ethylene/Butylene-Styrene-maleic anhydride-graft (SEBS-g-MA), and any mixtures thereof.

Optional Component D being at Least One Filler

The composite material may further comprise from 0 to 50.0 wt. % of component D being at least one filler based on the total weight of the composite material, preferably from 0.1 to 50.0 wt. %; more preferably from 0.2 wt. % to 40.0 wt. %, even more preferably from 5.0 wt. % to 10.0 wt. %.

For example, the at least one filler comprises at least one reinforcement material selected from carbon black, carbon fibers, carbon nanotubes, talc mineral filler, wollastonite, calcium carbonate, modified calcium carbonate, coated calcium carbonate, glass fibres, bamboo fibres, flax fibres, hemp fibres, and any mixture thereof. With preference, the at least one filler is or comprises talc.

For example, component D comprises one or more carbonaceous materials selected from carbon black, carbon fibers, carbon nanotubes and any mixture thereof.

For example, component D comprises one or more talc mineral fillers, with preference component D is one or more talc mineral fillers.

For example, the one or more talc mineral fillers of component D have a median particle size (d50) of less than 50 µm as determined according to ISO 13317-3 by Sedigraph, preferably less than 20 µm, more preferably less than 15 µm and most preferably at most 10 µm and/or a median particle size (d50) of at least 0.1 µm as determined according to ISO 13317-3 by Sedigraph, preferably at least 1.0 µm, more preferably at least 1.5 µm, even more preferably of at least 1.8 µm, most preferably of at least 2.0, and even most preferably of at least 2.1 µm.

Optional Component E being at Least One Elastomer

The composite material may further comprise from 0 to 30.0 wt. % of component E being at least one elastomer, preferably from 0.1 to 30.0 wt. % or from 0.1 to 20.0 wt. %. For example, the composite material comprises from 1.0 to 30.0 wt. % of component E based on the total weight of the composite material; preferably from 3.0 to 15.0 wt. %; more preferably from 5.0 to 10.0 wt. %.

For example, the at least one elastomer is selected from elastomeric copolymers of ethylene with 1-octene, elastomeric copolymers of ethylene with 1-butene, elastomeric copolymers of ethylene with propene, and any mixture thereof; and/or from SIS (Styrene isoprene styrene block copolymers), SEPS (Hydrogenated Styrene isoprene styrene block copolymers), SBS (Styrene butadiene styrene block copolymers), SEBS (Hydrogenated styrenic butadiene copolymers), SBSS (Styrene butadiene styrene styrene block copolymers), and any mixture thereof.

For example, component E, being at least one elastomer, has an MI2 ranging from 0.5 to 5.0 g/10 min as determined according to ISO 1133 conditions D, at a temperature of 190° C. and under a load of 2.16 kg, preferably component E has an MI2 of at most 4.5 g/10 min, more preferably of at most 4.0 g/10 min, even more preferably of at most 3.5 g/10 min, most preferably of at most 3.0 g/10 min, even most preferably of at most 2.5 g/10 min or at most 2.0 g/10 min.

According to a second aspect, the disclosure provides for a process to produce a composite material suitable for use as EMI shielding material according to the first aspect, the process being remarkable in that it comprises the step of blending:

a component A being a polymer resin which is at least one amorphous polymer resin or at least one semi-crystalline polymer resin selected from polyethylene resin and/or polypropylene resin;

from 15.0 to 60.0 wt % of component B being at least one metal-coated particle based on the total weight of the composite material; and from 0.5 to 5.0 wt. % of component C being one or more dispersants based on the total weight of the composite material; wherein one or more dispersants are selected from fatty acids, fatty acid derivatives, ethylene bis stearamide, functionalized waxes, maleic anhydride-grafted polymers and any mixture thereof;

to form a composite material in which the blend of components A, B and C has a density ranging from 0.8 to 2.0 g/cc as determined according to ISO 1183.

According to a third aspect, the disclosure provides for an EMI shield article remarkable in that it is made from a composite material according to the first aspect and/or produced according to the second aspect. With preference, EMI shield article has a shielding of at least 40 dB as determined using a coaxial measurement cell at a frequency ranging from 0.1 MHz to 20 GHz when moulded to form a plaque having a thickness ranging from 1.0 to 2.0 mm; with preference, a shielding of at least 50 dB and/or at a frequency ranging from 0.1 MHz to 18 GHz.

For example, the composite material or the blend of components A, B and C has a density ranging from 0.8 to 2.0 g/cc as determined by Hydrostatic balance (immersion) according to ISO 1183; for example, from 0.8 to 1.8 g/cc; for example, from 0.9 to 1.6 g/cc, for example, from 0.9 to 1.5 g/cc; for example, from 0.9 to 1.4 g/cc; for example, from 1.0 to 1.3 g/cc.

For example, the EMI shield article is an injected article and/or it is a panel with thickness ranging from 1.0 to 2.0 mm.

According to a fourth aspect, the disclosure provides for use of a composite material in an EMI shield article remarkable in that composite material is according to the first aspect and/or produced according to the second aspect. With preference, the EMI shield article is a panel and has a thickness ranging from 1.0 to 2.0 mm.

DETAILED DESCRIPTION

Figure 1:
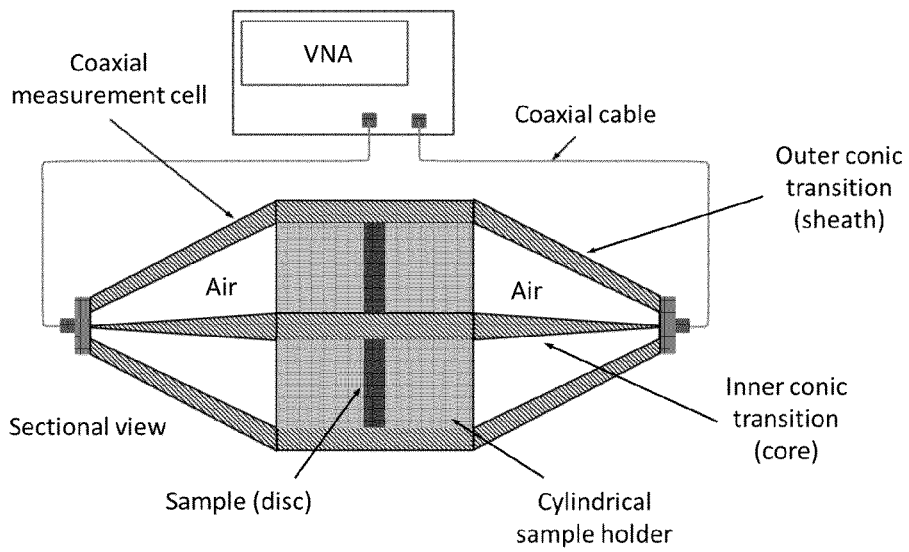
FIG. 1 is the scheme of the coaxial cell used to measure shielding in the 0.1 MHz-8 GHz frequency range.

When describing the polymers, composite materials, uses and processes of the disclosure, the terms employed are to be construed by the following definitions, unless a context dictates otherwise. For the disclosure, the following definitions are given:

As used herein, the term "catalyst" refers to a substance that causes a change in the rate of a polymerization reaction. In the present disclosure, it is especially applicable to catalysts suitable for the polymerization of propylene to polypropylene.

As used herein, a "polymer" is a polymeric compound prepared by polymerizing monomers, whether of the same or of a different type. The generic term polymer thus embraces the term homopolymer, usually employed to refer to polymers prepared from only one type of monomer, and the terms copolymer and interpolymer as defined below.

As used herein, a "copolymer", "interpolymer" and like terms mean a polymer prepared by the polymerization of at least two different types of monomers. These generic terms include polymers prepared from two or more different types of monomer, e.g. terpolymers, tetrapolymers, etc.

As used herein, "blend", "polymer blend" and like terms refer to a composition of two or more compounds, for example, two or more polymers or one polymer with at least one other compound.

As used herein, the term "melt blending" involves the use of shear force, extensional force, compressive force, ultrasonic energy, electromagnetic energy, thermal energy or combinations comprising at least one of the foregoing forces or forms of energy and is conducted in processing equipment wherein the aforementioned forces are exerted by a single screw, multiple screws, intermeshing co-rotating or counter-rotating screws, non-intermeshing co-rotating or counter-rotating screws, reciprocating screws, screws with pins, barrels with pins, rolls, rams, helical rotors, or combinations comprising at least one of the foregoing.

As used herein, the terms "polypropylene" (PP) and "propylene polymer" may be used synonymously. The term "polypropylene" encompasses polypropylene homopolymer resin, as well as copolymers of propylene which can be derived from propylene and a comonomer such as one or more selected from the group comprising $C_2$ or $C_4$-$C_{20}$ alpha-olefins, such as ethylene, 1-butene, 1-pentene, 1-hexene, 1-octene.

As used herein the terms "polyethylene" (PE) and "ethylene polymer" may be used synonymously. The term "polyethylene" encompasses homopolyethylene as well as copolymer of ethylene which can be derived from ethylene and a comonomer such as one or more selected from the group comprising 03-$C_{20}$ alpha-olefins, such as 1-butene, 1-propylene, 1-pentene, 1-hexene, 1-octene.

The term "polypropylene resin" or "polyethylene resin" as used herein refers to polypropylene or polyethylene fluff or powder that is extruded, and/or melted and/or pelletized and can be produced through compounding and homogenizing of the polypropylene resin as taught herein, for instance, with mixing and/or extruder equipment. As used herein, the term "polypropylene" may be used as a shorthand for "polypropylene resin".

The term "fatty acid" is used to define a product of the chemical formula is $C_nH_mO_2$ with n=6 to 24, and m=2*n (saturated), or m=2*n−2 (mono-unsaturated), or m=2*n−4 (bi-unsaturated), or m=2*n−6 (tri-unsaturated), etc.

The term "fluff" or "powder" as used herein refers to polymer material with the hard catalyst particle at the core of each grain and is defined as the polymer material after it exits the polymerization reactor (or the final polymerization reactor in the case of multiple reactors connected in series).

Under normal production conditions in a production plant, it is expected that the melt index (MI2) will be different for the fluff than for the polyethylene resin and for the polypropylene resin. Under normal production conditions in a production plant, it is expected that the density will be slightly different for the fluff, than for the polyethylene resin and the polypropylene resin. Unless otherwise indicated, density and melt index for the polyethylene resin and the polypropylene resin refer to the density and melt index as measured on the polyethylene resin and for the polypropylene resin as defined above.

As used herein the terms "composite material" are related to the blend of at least one polymer resin with at least one metal-coated particle.

The term "carbon particles" as used herein encompasses carbon nanotubes, carbon fibres, nanographene, carbon black and any combination thereof. wherein carbon nanotubes, carbon fibres, nanographene may have an average aspect ratio L/D of at least 10 and carbon black has an average aspect ratio L/D of less than 10.

The terms "comprising", "comprises" and "comprised of" as used herein are synonymous with "including", "includes" or "containing", "contains", and are inclusive or open-ended and do not exclude additional, non-recited members, elements or method steps. The terms "comprising", "comprises" and "comprised of" also include the term "consisting of".

The recitation of numerical ranges by endpoints includes all integer numbers and, where appropriate, fractions subsumed within that range (e.g. 1 to 5 can include 1, 2, 3, 4, 5 when referring to, for example, a number of elements, and can also include 1.5, 2, 2.75 and 3.80, when referring to, for example, measurements). The recitation of endpoints also includes the recited endpoint values themselves (e.g. from 1.0 to 5.0 includes both 1.0 and 5.0). Any numerical range recited herein is intended to include all sub-ranges subsumed therein.

As used herein, the term "masterbatch" refers to concentrates of active material (such as carbon) in a polymer, which is intended to be subsequently incorporated into another polymer miscible with the polymer already contained in the masterbatches.

The terms "virgin polymer" or "virgin resin" are used to denote a polymer or a resin directly obtained from a polymerization plant. The terms "virgin polypropylene" or "virgin polyethylene" are used to denote a polypropylene or a polyethylene directly obtained from a polymerization plant. The terms "directly obtained" is meant to include that the polypropylene or the polyethylene may optionally be passed through a pelletization step or an additivation step or both.

The terms "Post Consumer Resin", which may be abbreviated as "PCR", is used to denote a component of waste.

Throughout the present application the terms "polypropylene" and "propylene polymer" may be used synonymously. Similarly, the terms "polyethylene" and "ethylene polymer" may be used synonymously.

In the present disclosure, it is provided for a composite material suitable for use as EMI shielding material, remarkable in that it comprises:
- a component A being a polymer resin which is at least one amorphous polymer resin or at least one semi-crystalline polymer resin selected from polyethylene resin and/or polypropylene resin;
- from 15.0 to 60.0 wt. % of component B being at least one metal-coated particle based on the total weight of the composite material; and
- from 0.5 to 5.0 wt. % of component C being one or more dispersants based on the total weight of the composite material; wherein one or more dispersants are selected from fatty acids, fatty acid derivatives, ethylene bis stearamide, functionalized waxes, maleic anhydride-grafted polymers and any mixture thereof;

and in that the blend of components A, B and C has a density ranging from 0.8 to 2.0 g/cc as determined by ISO 1183.

The Composite Material

According to the disclosure, the composite material comprises component A being a polymer resin, component B being at least one metal-coated particle, component C being one or more dispersants, an optional component D being at least one filler, and an optional component E being at least one elastomer.

It is understood that the composite material comprises the addition of all components D, E and F, or of one or two of the components D, E or F. Thus, the composite materials according to the disclosure may comprise:
- components A, B and C, or
- components A, B, C and D, or
- components A, B, C and E, or
- components A, B, C, D and E.

Therefore, it is provided for a composite material suitable for use as EMI shielding material, remarkable in that it comprises:
- a component A being a polymer resin which is at least one amorphous polymer resin or at least one semi-crystalline polymer resin selected from polyethylene resin and/or polypropylene resin;

from 15.0 to 60.0 wt. % of component B being at least one metal-coated particle based on the total weight of the composite material;

from 0.5 to 5.0 wt. % of component C being one or more dispersants based on the total weight of the composite material; wherein one or more dispersants are selected from fatty acids, fatty acid derivatives, ethylene bis stearamide, functionalized waxes, maleic anhydride-grafted polymers and any mixture thereof.

from 0 to 50.0 wt. % of component D being at least one filler based on the total weight of the composite material; and from 0 to 30.0 wt. % of component E being at least one elastomer;

wherein the blend of components A, B and C has a density ranging from 0.8 to 2.0 g/cc as determined by ISO 1183.

In addition to the components A to C and optional components D to F, the composite material may also comprise at least one additive such as, by way of example, antioxidants, light stabilizers, acid scavengers, flame retardants, lubricants, antistatic additives, nucleating/clarifying agents, colourants.

The antioxidants used in the composite material of the present disclosure, preferably, have anti-gas fading properties. The preferred antioxidants are selected from the group comprising phosphites, hindered phenols, hindered amine stabilizers and hydroxylamines. An example of a suitable antioxidant additive is a blend of Irgafos® 168 and Irganox® 3114. Alternatively, phenol-free antioxidant additives are suitable as well, such as those based on hindered amine stabilizers, phosphites, hydroxylamines or any combination of these. In general, the antioxidants are added to the propylene homopolymer in an amount from 100 ppm to 2000 ppm with the exact amount depending upon the nature of the antioxidant, the processing conditions and other factors.

For example, the composite material has a shielding of at least 40 dB as determined using a coaxial measurement cell at a frequency ranging from 0.1 to 100 MHz when moulded to form a plaque having a thickness ranging from 1 to 2 mm; with preference a shielding of at least 50 dB and/or at a frequency ranging from 0.1 MHz to 20 GHz.

For example, the composite material or the blend of components A, B and C has a density ranging from 0.8 to 1.8 g/cc as determined by Hydrostatic weighing (immersion) according to ISO 1183; for example, from 0.9 to 1.6 g/cc; for example, from 0.9 to 1.5 g/cc; for example, from 0.9 to 1.4 g/cc; for example, from 1.0 to 1.3 g/cc.

For example, the composite material or the blend of components A, B and C has a density of less than 1.8 g/cc as determined by Hydrostatic weighing (immersion) according to ISO 1183; for example, less than 1.6 g/cc, for example, less than 1.5 g/cc; for example, less than 1.4 g/cc; for example, less than 1.3 g/cc.

For example, composite material or the blend of components A, B and C has a density of at least 0.8 g/cc as determined by Hydrostatic weighing (immersion) according to ISO 1183; for example, at least 0.9 g/cc, for example, at least 1.0 g/cc.

For example, the composite material wherein component A is at least one semi-crystalline polymer resin selected from one or more polypropylene resins, shows a young modulus of at least 500 MPa as determined by dynamic mechanical analysis according to ISO 6721-7 with preference of at least 1000 MPa. For example, the composite material wherein component A is one or more polypropylene resins, shows a young modulus ranging from 500 MPa to 5000 MPa as determined by dynamic mechanical analysis according to ISO 6721-7 preferably from 2000 to 4000 MPa.

For example, the composite material wherein component A is at least one semi-crystalline polymer resin, shows an elongation at break of at least 5% as determined according to ISO 527-1; preferably of at least 8%, more preferably of at least 10%. For example, the composite material wherein component A is at least one semi-crystalline polymer resin, shows an elongation at break ranging from 5% to 25% as determined according to ISO 527-1; preferably from 8% to 20%, more preferably of at least 10% to 18%.

Component a being a Polymer Resin

Component A is a polymer resin that is at least one amorphous polymer resin or at least one semi-crystalline polymer resin selected from polyethylene resin and/or polypropylene resin.

For example, component A is present in the composite material at a content ranging from 35 to 80 wt. % based on the total weight of the composite material; for example, from 38 to 78 wt. %; for example, from 40 to 75 wt. %; for example, from 45 to 70 wt. %; for example, from 50 to 65 wt. %.

For example, component A is present in the composite material at a content of at least 35 wt. % based on the total weight of the composite material; for example, of at least 38 wt. %; for example, of at least 40 wt %; for example, of at least 45 wt. %; for example, of at least 50 wt. %.

For example, component A is present in the composite material at a content of at most 80 wt. % based on the total weight of the composite material; for example, of at most 78 wt. %; for example, of at most 75 wt. %; for example, of at most 70 wt. %; for example, of at most 65 wt. %.

For example, component A is selected from a virgin polymer resin, a post-consumer polymer resin and a blend of a virgin polymer resin and a post-consumer polymer resin.

For example, component A comprises from 5 to 100 wt. % of post-consumer polymer resin based on the total weight of component A; for example, from 20 to 95 wt. %; for example, from 40 to 90 wt. %; for example, from 50 to 85 wt. %; for example, from 60 to 80 wt. %.

Selection of Component a to be Polypropylene

In an embodiment, component A is or comprises a semi-crystalline polymer resin being at least one polypropylene resin.

In an embodiment, the at least one polypropylene resin is present in the composite material at a content ranging from 35 to 80 wt. % based on the total weight of the composite material; for example, from 38 to 78 wt. %; for example, from 40 to 75 wt. %; for example, from 45 to 70 wt. %; for example, from 50 to 65 wt. %.

For example, at least one polypropylene resin is selected from isotactic polypropylene resin and syndiotactic polypropylene resin; for example, at least one polypropylene resin is isotactic.

When the at least one polypropylene resin is isotactic, it is characterized by an isotacticity for which the content of mmmm pentads is measured. Preferably, the content of mmmm pentads polypropylene has a content of mmmm pentads of at least 90% as determined by $^{13}$C-NMR analysis, preferably at least 95%, more preferably at least 98% and even more preferably of at least 99%.

The isotacticity may be determined by $^{13}$C-NMR analysis as described in the test methods. Bovey's NMR nomenclature for an isotactic pentad is . . . mmmm . . . with each "m" representing a "meso" dyad or successive methyl groups on the same side in the plane. As known in the art, any deviation or inversion in the structure of the chain lowers the degree of isotacticity and crystallinity of the polymer.

For example, at least one polypropylene resin is selected from a virgin polypropylene resin, a polypropylene post-consumer resin and a blend of a virgin polypropylene resin and a polypropylene post-consumer resin.

For example, at least one polypropylene resin is selected from a propylene homopolymer, a copolymer of propylene with one or more comonomers selected from ethylene and $C_4$-$C_{20}$ alpha-olefins, a heterophasic polypropylene and any mixture thereof. In a preferred embodiment, at least one polypropylene resin is selected from a copolymer of propylene with one or more comonomers selected from ethylene and $C_4$-$C_{20}$ alpha-olefins, a heterophasic polypropylene and any mixture thereof.

In an example, at least one polypropylene resin is or comprises a homopolymer of propylene. A propylene homopolymer according to this disclosure has less than 0.2 wt. %, preferably, less than 0.1 wt. %, more preferably, less than 0.05 wt. % and most preferably, less than 0.005 wt. %, of alpha-olefins other than propylene in the polymer. Even most preferably, no other alpha-olefins are detectable. Accordingly, when a polypropylene resin is a homopolymer of propylene, the comonomer content in the polypropylene is less than 0.2 wt. %, more preferably, less than 0.1 wt. %, even more preferably, less than 0.05 wt. % and most preferably, less than 0.005 wt. % based on the total weight of the polypropylene.

In an example, at least one polypropylene resin is or comprises a copolymer of propylene and one or more comonomers. Suitable comonomers can be selected from the group consisting of ethylene and aliphatic $C_4$-$C_{20}$ alpha-olefins. Examples of suitable aliphatic $C_4$-$C_{20}$ alpha-olefins include 1-butene, 1-pentene, 4-methyl-1-pentene, 1-hexene, 1-octene, 1-decene, 1-dodecene, 1-tetradecene, 1-hexadecene, 1-octadecene and 1-eicosene. Preferably, the comonomer is ethylene or 1-hexene. More preferably, the comonomer is ethylene.

In an example, at least one polypropylene resin is or comprises at least one propylene copolymer. The at least one propylene copolymer can be a random copolymer, a heterophasic copolymer or a mixture thereof.

The at least one random propylene copolymer comprises at least 0.1 wt. % of one or more comonomers, preferably at least 1 wt. %. The at least one random propylene copolymer comprises up to 10 wt. % of one or more comonomers and most preferably up to 6 wt. %. Preferably, the at least one random copolymer is at least one copolymer of propylene and ethylene.

The at least one heterophasic propylene copolymer comprises a matrix propylene polymer phase and a dispersed phase of a rubber. With preference, the rubber is ethylene-propylene rubber (EPR).

The heterophasic propylene copolymers of the present disclosure as defined above can be produced by sequential polymerization in a series of polymerization reactors in presence of a catalyst system, wherein in a first polymerization stage the propylene polymer is produced, and in a second polymerization stage the rubber is produced by copolymerizing ethylene and at least one further olefin different from ethylene. The catalyst system is added to the first polymerization stage.

Thus, with preference, at least one polypropylene resin is or comprises a heterophasic polypropylene resin comprising:
  i. from 60 to 95 wt. % based on the total weight of the heterophasic polypropylene resin of a polypropylene-based matrix selected from a homopolymer and/or a copolymer of propylene with one or more comonomers selected from ethylene and $C_4$-$C_{20}$ alpha-olefins, and
  ii. from 40 to 50 wt. % based on the total weight of the heterophasic polypropylene resin of a dispersed ethylene-alpha-olefin copolymer;

more preferably, the alpha-olefin in the ethylene-alpha-olefin copolymer is selected from the group of alpha-olefins having from 3 to 8 carbon atoms and/or the alpha-olefin in the ethylene-alpha-olefin copolymer is in the range of 25 to 70 wt. % based on the total weight of the ethylene-alpha-olefin copolymer.

For example, the at least one polypropylene resin has a melt index MI2 ranging from 4 to 260 g/10 min as determined according to ISO 1133 at 230° C. under a load of 2.16 kg; for example, from 5 to 200 g/10 min; for example, from 6 to 180 g/10 min; for example, from 7 to 160 g/10 min; for example, from 8 to 80 g/10 min; for example, from 4 to 80 g/10 min. The value of MI2 of the at least one polypropylene resin used as component A is obtained without a degradation treatment.

For example, the at least one polypropylene resin has a melt index MI2 of at least 4 g/10 min, preferably of at least 5 g/10 min, more preferably of at least 6 g/10 min, even more preferably of at least 7 g/10 min, most preferably of at least 8 g/10 min, and even most preferably of at least 10 g/10 min as measured according to ISO 1133 at 230° C. under a load of 2.16 kg. The value of MI2 of the at least one polypropylene resin is obtained without a degradation treatment.

More preferably, the at least one polypropylene resin has a melt index MI2 of at most 260 g/10 min as measured according to ISO 1133 at 230° C. under a load of 2.16 kg, preferably of at most 200 g/10 min, more preferably of at most 180 g/10 min, even more preferably of at most 160 g/10 min; most preferably of at most 100 g/10 min; even most preferably of at most 80 g/10 min or of at most 50 g/10 min. The value of MI2 of the at least one polypropylene resin is obtained without a degradation treatment.

In an embodiment, the at least one polypropylene resin has a melt index MI2 ranging from 4 to 80 g/10 min as determined according to ISO 1133 at 230° C. under a load of 2.16 kg; for example, from 5 to 50 g/10 min; for example, from 6 to 40 g/10 min; for example, from 7 to 30 g/10 min; for example, from 8 to 25 g/10 min. This embodiment is preferred when the composite material is devoid of carbon particles or when the composite material comprises carbon particles wherein the carbon particles are provided in the form of a masterbatch.

The at least one polypropylene resin has a monomodal molecular weight distribution or a multimodal molecular weight distribution, for example, a bimodal molecular weight distribution.

The at least one polypropylene resin can be produced by polymerizing propylene and one or more optional comonomers, in the presence of a catalyst being a metallocene catalyst or a Ziegler-Natta catalyst.

In a preferred example, the catalyst system may comprise a Ziegler-Natta catalyst. The term "Ziegler-Natta catalyst" refers to catalysts of the general formula MXn, wherein M is a transition metal compound selected from groups IV to VII, wherein X is a halogen, and wherein n is the valence of the metal. Preferably, the metal is titanium, chromium or vanadium. Most preferably, the metal is titanium.

The Ziegler-Natta catalyst system, under the disclosure, comprises a titanium compound having at least one titanium-halogen bond and an internal electron donor, both on a suitable support, an organoaluminium compound, and an optional external electron donor. Suitable support is, for example, a magnesium halide in an active form. A suitable external electron donor (ED) is, for example, phthalate or succinate or a diether compound. The organoaluminium compound used in the process of the present disclosure is triethyl aluminium (TEAL).

Advantageously, the triethyl aluminium has a hydride content, expressed as $AlH_3$, of less than 1.0 wt. % for the triethyl aluminium. More preferably, the hydride content is less than 0.5 wt. %, and most preferably, the hydride content is less than 0.1 wt. %. It would not depart from the scope of the disclosure if the organoaluminium compound contains minor amounts of other compounds of the trialkyl aluminium family, such as triisobutyl aluminium, tri-n-butyl aluminium, and linear or cyclic alkyl aluminium compounds containing two or more Al atoms, provided they show polymerization behaviour comparable to that of TEAL.

In the process of the present disclosure, the molar ratio Al/Ti is not particularly specified. However, it is preferred that the molar ratio Al/Ti is at most 100.

If an external electron donor is present, it is preferred that the molar ratio Al/ED, with ED denoting external electron donor, is at most 120, more preferably, it is within the range of 5 to 120, and most preferably, within the range of 10 to 80. Before being fed to the polymerization reactor, the catalytic system preferably undergoes a premix and/or a pre-polymerization step. In the premix step, the triethyl aluminium (TEAL) and the external electron donor (ED)—if present—, which have been pre-contacted, are mixed with the Ziegler-Natta catalyst at a temperature within the range of 0° C. to 30° C., preferably, within the range of 5° C. to 20° C., for up to 15 min. The mixture of TEAL, an external electron donor (if present) and Ziegler-Natta catalyst is pre-polymerized with propylene at a temperature within the range of 10° C. to 100° C., preferably, within the range of 10° C. to 30° C., for 1 to 30 min, or for 2 to 20 min.

In the first stage, the polymerization of propylene and one or more optional comonomers can, for example, be carried out in liquid propylene as reaction medium (bulk polymerization). It can also be carried out in one or more diluents, such as hydrocarbon that is inert under polymerization conditions (slurry polymerization). It can also be carried out in the gas phase. Those processes are well known to one skilled in the art.

Diluents, which are suitable for being used under the present disclosure, may comprise but are not limited to hydrocarbon diluents such as aliphatic, cycloaliphatic and aromatic hydrocarbon solvents, or halogenated versions of such solvents. Non-limiting illustrative examples of solvents are butane, isobutane, pentane, hexane, heptane, cyclopentane, cyclohexane, cycloheptane, methyl cyclopentane, methyl cyclohexane, isooctane, benzene, toluene, xylene, chloroform, chlorobenzenes, tetrachloroethylene, dichloroethane and trichloroethane.

For the present disclosure, the propylene polymers are preferably produced by polymerization in liquid propylene at temperatures within the range of 20° C. to 100° C. Preferably, temperatures are within the range of 60° C. to 80° C. The pressure can be atmospheric or higher. Preferably, the pressure is ranging between 2.5 and 5.0 MPa.

Hydrogen is used to control the chain lengths of the propylene polymers. For the production of a propylene polymer with higher MI2, i.e. with lower average molecular weight and shorter polymer chains, the concentration of hydrogen in the polymerization medium needs to be increased. Inversely, the hydrogen concentration in the polymerization medium has to be reduced to produce a propylene polymer with lower MI2, i.e. with higher average molecular weight and longer polymer chains.

In such a sequential arrangement of polymerization reactors, the propylene homopolymer withdrawn from one reactor is transferred to the one following in the series, where the polymerization is continued. To produce propylene homopolymer fractions of different melt indexes, the polymerization conditions in the respective polymerization reactors need to be different; for example, in that the hydrogen concentration in the polymerization reactors differs.

The melt index MI2 of the propylene polymer produced in the second reactor is calculated using the following equation (2):

$$\text{Log}(MI2_{final}) = w_{B1} \times (\text{Log } MI2_{B1}) + w_{B2} \times \text{Log}(MI2_{B2}) \quad (2)$$

wherein $MI2_{final}$ is the melt index MI2 of the total propylene polymer produced, $MI2_{B1}$ and $MI2_{B2}$ are the respective melt index MI2 of the propylene polymers fractions produced in the first and the second polymerization loop reactors, and $w_{B1}$ and $w_{B2}$ are the respective weight fractions of the propylene polymers produced in the first and in the second polymerization loop reactors as expressed in weight percent (wt. %) of the total propylene polymer produced in the two polymerization loop reactors. These weight fractions are also commonly described as the contribution by the respective loop.

The matrix propylene polymer, preferably, propylene homopolymer, can be made, for example, in loop reactors or in a gas phase reactor. The propylene polymer produced in this way, in a first polymerization stage, is transferred to a second polymerization stage, into one or more secondary reactors where ethylene and at least one further olefin different from ethylene are added to produce the rubber. For example, the further olefin is propylene. Thus, the rubber produced is ethylene-propylene rubber (EPR). Preferably, this polymerization step is done in a gas phase reactor. The propylene copolymer can be prepared using a controlled morphology catalyst that produces rubber spherical domains dispersed in a polypropylene matrix. The amount and properties of the components are controlled by the process conditions.

The average molecular weight of the rubber, for which the intrinsic viscosity is a measure, is controlled by the addition of hydrogen to the polymerization reactors of the second polymerization stage. The amount of hydrogen added is such that the rubber has an intrinsic viscosity of at least 2.0 dl/g, and of at most 5.5 dl/g, measured in tetralin at 135° C. following ISO 1628. The contribution of the second polymerization stage, i.e. the rubber content of the heterophasic propylene copolymer is from 5 to 50 wt. % relative to the total weight of the heterophasic propylene copolymer.

After the last polymerization reactor, the polymers are recovered as a powder and can then be pelletized or granulated.

Examples of polypropylene resins suitable to be used as component A are commercially available from Total®. A non-limitative example is PPC7760 with a melt index MI2 of 15.0 g/10 min. Another example is PPH 7060 with a melt index MI2 of 12 g/10 min. Another example is PPC 6742 with a melt index MI2 of 8 g/10 min. Another example is MH140CN0, with a melt index MI2 of 140 g/10 min. All MI2 are determined according to ISO 1133 at 230° C. under a load of 2.16 kg.

For example, the at least one polypropylene resin is selected from a virgin polypropylene resin, a polypropylene post-consumer resin and a blend of a virgin polypropylene resin and a polypropylene post-consumer resin.

In one or more embodiments, the at least one polypropylene resin comprises a post-consumer polypropylene resin at a content ranging from 5 to 100 wt. % of polypropylene post-consumer resin based on the total weight of component A; for example, from 20 to 95 wt %; for example, from 40 to 90 wt. %; for example, from 50 to 85 wt. %; for example, from 60 to 80 wt %.

When the at least one polypropylene resin is or comprises a post-consumer resin; the MI2 of the polypropylene post-consumer resin can be selected in the same manner as for the virgin resin.

For example, the at least one polypropylene resin is or comprises a post-consumer polypropylene resin; wherein the post-consumer polypropylene resin is a blend of recycled polypropylene and at least one recycled polymer different from polypropylene, with the content of the recycled polypropylene ranging from 75.0 to 97.0 wt. % relative to the total weight of the post-consumer resin. The person skilled in the art advantageously selects a post-consumer polypropylene resin that comprises recycled polyethylene, for example, in a content ranging from 3.0 to 25.0 wt. % based on the post-consumer polypropylene resin, to boost the impact properties of the composite material. In a preferred embodiment, the post-consumer polypropylene resin comprises less than 10 wt. % based on the total weight of the recycled resin of polymers other than polypropylene. For example, the post-consumer polypropylene resin may contain up to 10.0 wt. % of polyethylene based on the total weight of the post-consumer polypropylene resin; for example, from 3.0 to 10.0 wt. %. For example, the post-consumer polypropylene resin may contain from 10.0 to 25.0 wt. % of polyethylene based on the total weight of the post-consumer polypropylene resin.

An example of a commercially available polypropylene post-consumer resin (PCR-PP), that can be used according to the disclosure, is PP Regranulat 500-S or PP Regranulat 530-S marketed by Vogt Plastic GmbH.

The polypropylene post-consumer resin (PCR-PP) that can be used under the disclosure is preferably originated from a specific collection of domestic or household waste, and/or from the end of life vehicles (ELV) waste.

Selection of Component a to be Polyethylene

In an embodiment, component A is or comprises a semi-crystalline polymer resin being at least one polyethylene resin.

In an embodiment, the at least one polyethylene resin is present in the composite material at a content ranging from 35 to 85 wt. % based on the total weight of the composite material; for example, from 38 to 80 wt. %; for example, from 40 to 75 wt. %; for example, from 45 to 70 wt. %; for example, from 50 to 65 wt. %.

The at least one polyethylene resin is preferably selected from an ethylene homopolymer, a copolymer of ethylene with one or more comonomers selected from $C_3$-$C_{20}$ alpha-olefins and any mixture thereof.

In an example, the at least one polyethylene resin is a homopolymer of ethylene. An ethylene homopolymer according to this disclosure has less than 0.2 wt. %, preferably, less than 0.1 wt. %, more preferably, less than 0.05 wt. % and most preferably, less than 0.005 wt. %, of alpha-olefins other than ethylene in the polymer. Even most preferably, no other alpha-olefins are detectable. Accordingly, when the polyethylene resin is a homopolymer of ethylene, the comonomer content in the polyethylene is less than 0.2 wt. %, more preferably, less than 0.1 wt. %, even more preferably, less than 0.05 wt. % and most preferably, less than 0.005 wt. % based on the total weight of the polyethylene.

The at least one polyethylene resin may be a copolymer of ethylene and one or more comonomers, or a mixture thereof. Suitable comonomers can be selected from the group consisting of aliphatic $C_3$-$C_{20}$ alpha-olefins. Examples of suitable aliphatic $C_3$-$C_{20}$ alpha-olefins include propylene, 1-butene, 1-pentene, 4-methyl-1-pentene, 1-hexene, 1-octene, 1-decene, 1-dodecene, 1-tetradecene, 1-hexadecene, 1-octadecene and 1-eicosene. Preferably, the comonomer is propylene or 1-hexene. More preferably, the comonomer is propylene.

In an example, the at least one polyethylene resin is an ethylene copolymer. The ethylene copolymer comprises at least 0.1 wt. % of one or more comonomers, preferably at least 1 wt. %.

The ethylene copolymer comprises up to 10 wt. % of one or more comonomers and most preferably up to 6 wt. %. Preferably, the ethylene copolymer is a copolymer of propylene and ethylene.

The density of the at least one polyethylene resin ranges from 0.820 g/cm$^3$ to 0.980 g/cm$^3$. Preferably, the at least one polyethylene resin has a density of at most 0.960 g/cm$^3$, or of at most 0.940 g/cm$^3$ or of at most 0.939 g/cm$^3$ or of at most 0.936 g/cm$^3$. Preferably, the at least one polyethylene resin has a density of at least 0.850 g/cm$^3$, more preferably of at least 0.900 g/cm$^3$, even more preferably of at least 0.910 g/cm$^3$ and most preferably of at least 0.915 g/cm$^3$. The density is determined according to ISO 1183 at a temperature of 23° C. The at least one polyethylene resin comprises linear low-density polyethylene (LLDPE), low-density polyethylene (LDPE), medium-density polyethylene (MDPE), high-density polyethylene (HDPE), and mixtures thereof. For example, the at least one polyethylene resin is or comprises high-density polyethylene (HDPE).

High-density polyethylene (HDPE) is defined to have a density of at least 0.940 g/cm$^3$. Medium-density polyethylene (MDPE) has a density ranging from 0.926-0.940 g/cm$^3$. Low-density polyethylene (LDPE) has a density ranging from 0.917-0.930 g/cm$^3$. Linear low-density polyethylene (LLDPE) has a density ranging from 0.910-0.940 g/cm$^3$.

In one or more embodiments, the at least one polyethylene resin has a melt index MI2 ranging from 0.01 to 100 g/10 min or from 0.1 to 100 g/10 min as determined according to ISO 1133 at 190° C. under a load of 2.16 kg; for example, from 0.5 to 80 g/10 min; for example, from 1 to 50 g/10 min; for example, from 2 to 40 g/10 min, for example, from 3 to 30 g/10 min; for example, from 4 to 25 g/10 min; for example, from 5 to 20 g/10 min; for example, from 4 to 18 g/10 min; for example, from 0.1 to 20 g/10 min. The value of MI2 of the at least one polyethylene resin is obtained without a degradation.

For example, the at least one polyethylene resin has a melt index MI2 of at least 0.01 g/10 min; preferably at least 0.05 g/10 min; preferably at least 0.1 g/10 min, preferably of at least 0.5 g/10 min, more preferably of at least 1 g/10 min, even more preferably of at least 2 g/10 min, most preferably of at least 3 g/10 min, and even most preferably of at least 4 g/10 min or at least 5 g/10 min as measured according to ISO 1133 at 190° C. under a load of 2.16 kg. The value of MI2 of the at least one polyethylene resin is obtained without a degradation treatment.

For example, the at least one polyethylene resin has a melt index MI2 of at most 100 g/10 min, preferably of at most 80 g/10 min, more preferably of at most 50 g/10 min, even more preferably of at most 40 g/10 min; most preferably of at most 30 g/10 min, even most preferably of at most 25 g/10 min or of at most 20 g/10 min or at most 18 g/10 min or of at most 15 g/10 min or of at most 10 g/10 min as measured according to ISO 1133 at 190° C. under a load of 2.16 kg. The value of MI2 of the at least one polyethylene resin is obtained without a degradation treatment.

In an embodiment, the at least one polyethylene resin has a melt index MI2 ranging from 0.1 to 20 g/10 min as determined according to ISO 1133 at 190° C. under a load of 2.16 kg; for example, from 0.5 to 15 g/10 min; for example, from 0.8 to 10 g/10 min; for example, from 1 to 9 g/10 min; for example, from 2 to 8 g/10 min. This embodiment is preferred when the composite material is devoid of carbon particles or when the composite material comprises carbon particles wherein the carbon particles are provided in the form of a masterbatch.

The at least one polyethylene resin has a monomodal molecular weight distribution or a multimodal molecular weight distribution, for example, a bimodal molecular weight distribution.

The at least one polyethylene resin can be produced by polymerizing propylene and one or more optional comonomers, in the presence of a catalyst being a metallocene catalyst or a Ziegler-Natta catalyst.

Examples of polyethylene resins suitable to be used as component A are commercially available from Total®. A non-limitative example is HDPE 5502 with an MI2 of 0.25 g/10 min and a density of 0.954 g/cm$^3$. Another example is Lumicene Supertough 22ST05 with an MI2 of 0.5 g/10 min and a density of 0.932 g/cm$^3$. Another example is FE 8000 with an MI2 of 0.8 g/10 min and a density of 0.924 g/cm$^3$. Another example is Lumicene M2710EP with an MI2 of 0.9 g/10 min and a density of 0.927 g/cm$^3$. Another example is Q1018N with an MI2 of 1.0 g/10 min and a density of 0.918 g/cm$^3$. Another example is M3581UV with an MI2 of 6 g/10 min and a density of 0.935 g/cm$^3$. All MI2 are determined according to ISO 1133 at 190° C. under a load of 2.16 kg.

For example, the at least one polyethylene resin is selected from a virgin polyethylene resin, a post-consumer polyethylene resin and a blend of a virgin polyethylene resin and a post-consumer polyethylene resin.

In one or more embodiments, the at least one polyethylene resin comprises a post-consumer polyethylene resins at a content ranging from 5 to 100 wt. % of post-consumer polyethylene resin based on the total weight of component A; for example, from 20 to 95 wt. %; for example, from 40 to 90 wt. %; for example, from 50 to 85 wt. %; for example, from 60 to 80 wt. %.

When the at least one polyethylene resin is or comprises a post-consumer polyethylene resin; the MI2 of the post-consumer polyethylene resin can be selected in the same manner as for the virgin resin.

An example of a commercially available stream of post-consumer polyethylene resin (PCR-PE) that can be used according to the disclosure is KWR105M2 marketed by KW Plastics.

The post-consumer polyethylene resin (PCR-PE) that can be used under the disclosure is preferably selected from HDPE dairy or industrial packaging waste.

For example, the at least one polyethylene resin is or comprises a post-consumer polyethylene resin; wherein the post-consumer polyethylene resin is a blend of recycled polyethylene and at least one recycled polymer different from polyethylene, with the content of the recycled polyethylene is ranging from 75.0 to 97.0 wt. % relative to the total weight of the post-consumer polyethylene resin. In a preferred embodiment, the post-consumer polyethylene resin comprises less than 10 wt. % based on the total weight of the recycled resin of polymers other than polyethylene. For example, the post-consumer polyethylene resin may contain up to 10 wt. % of polypropylene based on the total weight of the post-consumer polyethylene resin; for example, from 3 to 10 wt. %.

In an embodiment, component A is or comprises a semi-crystalline polymer resin being a mixture of at least one polypropylene resin and at least polyethylene resin, wherein the at least one polypropylene resin and the at least polyethylene resin are as defined above.

Selection of Component a to be Amorphous Polymer

In an embodiment, component A is or comprises an amorphous polymer resin. With preference, the at least one amorphous polymer resin is or comprises polystyrene.

In one or more embodiments, the at least one amorphous polymer resin is present in the composite material at a content ranging from 35 to 80 wt. % based on the total weight of the composite material; for example, from 38 to 78 wt. %; for example, from 40 to 75 wt. %; for example, from 45 to 70 wt. %; for example, from 50 to 65 wt. %.

The amorphous polymers considered by the disclosure for the at least one amorphous polymer resin are selected from polystyrene (PS), acrylonitrile-butadiene-styrene (ABS), polycarbonate (PC), styrene-acrylonitrile (SAN), poly(methyl methacrylate) (PMMA), polyvinyl chloride (PVC), polybutadiene (PBu), polybutylene terephthalate (PBt), poly (p-phenylene oxide) (PPO), polysulfone (PSU), polyethersulfone (PES), polyethylenimine (PEI), polyphenylsulfone (PPSU), acrylonitrile styrene acrylate (ASA) or any combination thereof.

In a preferred embodiment, the at least one amorphous polymer resin is a polystyrene resin, a modified polystyrene resin or a mixture of a polystyrene resin and a modified polystyrene resin. For example, the polystyrene resin is a general-purpose polystyrene (GPPS).

In an embodiment, wherein a masterbatch is used to provide carbon particles the at least one amorphous polymer resin used as component A and the amorphous polymer resin used in the masterbatch differ from each other by the polymer-type. For example, one amorphous polymer is polystyrene and the other one is acrylonitrile-butadiene-styrene or styrene acrylonitrile. In another example, one amorphous polymer is styrene-acrylonitrile and the other one is a mixture of polystyrene and polybutadiene. In an embodiment, the at least one amorphous polymer resin used as component A and the amorphous polymer resin used in the masterbatch differ from each other by their melt flow index (MFI), the MFI is determined according to ISO 1133.

Non-limiting examples of suitable polystyrenes which can be used in the composite material as component A comprise polystyrene (for example General Purpose Polystyrene—GPPS), modified polystyrene (for example High Impact Polystyrene—HIPS), or combination of polystyrene and modified polystyrene. Combination of polystyrene and modified polystyrene is to be understood as any mixture of polystyrene and modified polystyrene. With preference, at least one amorphous polymer resin is selected from polystyrene, modified polystyrene, or combination of polystyrene and modified polystyrene.

In the modified-polystyrene, part of the styrene may be replaced by unsaturated monomers copolymerizable with styrene, for example alpha-methylstyrene or (meth)acrylates. Other examples which may be mentioned are chloropolystyrene, poly-alpha-methylstyrene, styrene-chlorostyrene copolymers, styrene-propylene copolymers, styrenebutadiene copolymers, styrene-isoprene copolymers, styrene-vinyl chloride copolymers, styrene-vinyl acetate copolymers, styrene-alkyl acrylate copolymers (methyl, ethyl, butyl, octyl, phenyl acrylate), styrene-alkyl methacrylate copolymers (methyl, ethyl, butyl, phenyl methacrylate), styrene methyl chloroacrylate copolymers and styrene-acrylonitrile-alkyl acrylate copolymers. The polystyrenes for use in the present disclosure may be co- or homopolymers of styrene, alpha methyl styrene and para methyl styrene. Preferably, the polystyrene is homopolystyrene.

The polystyrenes may be prepared by several methods. This process is well known to those skilled in the art. An example of a method to produce polystyrene is given in EP2401311. An example of a method to produce high impact polystyrene (HIPS) is given in US2012/0289656.

The modified-polystyrene for use in the composite material may be rubber modified.

The rubber may be prepared by several methods, preferably by emulsion or solution polymerization. These processes are well known to those skilled in the art. If present, preferably the rubber is present in an amount from about 3 to 15% by weight relative to the total weight of the modified-polystyrene. Polybutadiene is a particularly useful rubber.

Preferably the modified-polystyrene is rubber modified polystyrene.

In an embodiment, the rubber-modified polystyrene is a High Impact Polystyrene (HIPS). The process for making HIPS is well known to those skilled in the art. For example, the process may comprise polymerizing styrene monomer in the presence of dissolved rubber. Polymerization of styrene, and optionally a comonomer, may be initiated by heating and/or by an initiator, by way of example a radical initiator. The rubber may be "dissolved" in the styrene monomer. The usual rubber types utilized in the manufacture of HIPS include polybutadiene (PBu), styrene-butadiene rubber (SBR), and styrene-butadiene-styrene rubber (SBS). Polystyrene may be initially formed from the styrene monomer within the homogeneous rubber solution in styrene. In HIPS, a part of the styrene may be replaced by unsaturated monomers copolymerizable with styrene such as other monovinylaromatic monomers, alkyl esters of acrylic or methacrylic acid and acrylonitrile. Non-limiting examples of suitable processes for preparing HIPS are described in US2010/240832, incorporated herein by reference. Advantageously, the modified-polystyrene is a HIPS or a mixture of polystyrene and HIPS.

Preferably the at least one amorphous polymer resin is characterized by a high load melt flow index HLMI of more than 30 g/10 min according to IS01 133 (21.0.6 kg-200° C.); for example, more than 40 g/10 min; for example, more than 50 g/10 min.

For example, the amorphous polymer resin has an MFI of at least 10 g/10 min as measured at 200° C. under a load of 5 kg according to IS01133.

Examples of polystyrene resins suitable as component A are commercially available from Total®. For example, crystal polystyrene 1960N with an MFI of 30 g/10 min (5 kg-200° C.). For example, impact polystyrene 8260 with an MFI of 2.8 g/10 min (5 kg-200° C.).

For example, the at least one amorphous polymer resin is selected from a virgin amorphous polymer resin, an amorphous polymer post-consumer resin and a blend of a virgin amorphous polymer resin and an amorphous polymer post-consumer resin.

The at least one amorphous polymer resin may comprise an amorphous polymer post-consumer resin; for example, the at least one amorphous polymer resin comprises from 5 to 100 wt. % of amorphous polymer post-consumer resin based on the total weight of the amorphous polymer resin; for example, from 20 to 95 wt. %; for example, from 40 to 90 wt. %, for example, from 50 to 85 wt. %; for example, from 60 to 80 wt. %.

An example of polystyrene comprising 20 wt. % of polymer post-consumer resin that is commercially available from Total® is XLR 5550.

When at least one amorphous polymer resin is or comprises a post-consumer resin; the MFI of the amorphous resin post-consumer resin can be selected in the same manner as for the virgin resin.

The Component B being Metal-Coated Particles

Component B is at least one metal-coated particle and is present in the composite material in a content ranging from 15.0 to 60.0 wt. % based on the total weight of the composite material.

For example, component B is present in a content ranging from 20.0 to 55.0 wt. % based on the total weight of the composite material; for example, from 22.0 to 50.0 wt. %; for example, from 25.0 to 45.0 wt. %. For example, component B is present in a content of at least 20.0 wt. % based on the total weight of the composite material; for example, at least 22.0 wt. % for example, at least 25.0 wt. %. For example, component B is present in a content of at most 55.0 wt. % based on the total weight of the composite material; for example, at most 50.0 wt. % for example, at most 45.0 wt. %.

For example, component B has a density of less than 4.0 g/cc; for example, less than 3.5 g/cc, for example, less than 3.2 g/cc. For example, less than 3.0 g/cc; for example, less than 2.9 g/cc.

For example, component B has a density of at least 0.8 g/cc; for example, at least 1.0 g/cc; for example, at least 1.5 g/cc; for example, at least 2.0 g/cc; for example, at least 2.2 g/cc.

For example, the metal-coated particles are or comprise metal-coated fibres with a length to diameter ratio of at least 5; with preference, the length to diameter ratio is at least 10 and/or the length to diameter ratio is at most 100. For example, the metal-coated particles are or comprise metal-coated fibres wherein the fibres are selected from glass fibres, carbon fibres, polymer fibres, natural fibres and any mixture thereof; with preference, the metal-coated particles are or comprise metal-coated glass-fibres.

The natural fibres can be plant fibres and/or animal fibres; with preference, the natural fibres are selected from abaca fibres, bamboo fibres, banana fibres, coir fibres, coconut husk fibres, cotton fibres, flax fibres, henequen fibres, hemp fibres, hop fibres, jute fibres, palm fibres, ramie fibres, sisal fibres, vine branch fibres, miscanthus fibres, cellulose fibres, wood fibres and/or cork fibres. For example, the natural fibres are or comprise sisal fibres.

For example, the metal-coated particles are or comprise metal-coated fibres wherein fibres have an average length of at least 100 μm and/or an average diameter of at least 5 μm.

For example, the at least one metal-coated particle is or comprises metal-coated fibres wherein the metal-coated fibres have an average length of at least 100 μm, preferably of at least 150 μm, such as an average length ranging from 100 μm to 500 μm, for example, ranging from 150 to 400 μm or from 160 to 300 μm.

For example, the at least one metal-coated particle is or comprises metal-coated fibres wherein the metal-coated fibres have an average diameter of at least 5 μm; preferably at least 10 µm; such as an average diameter ranging from 5 to 50 µm, for example, from 10 to 40 µm or from 12 to 30 µm.

For example, the metal of the metal-coated particles is selected from silver, copper, gold, aluminium, tungsten, zinc, cobalt, nickel, iron, titanium, platinum, or any mixture thereof; with preference, from silver, copper, gold, aluminium, tungsten, zinc, cobalt, nickel, iron; more preferably, the metal is silver.

For example, the metal-coated particles comprise from 1 to 50 wt. % of metal based on the total weight of the metal-coated particles, preferably from 5 to 30 wt. % or from 6 to 25 wt. %.

Component C being One or More Dispersants

The one or more dispersants are present in the composite material in a content ranging from 0.5 to 5.0 wt. % based on the total weight of the composite material.

For example, component C is present in a content ranging from 1.0 to 4.5 wt. % based on the total weight of the composite material; for example, from 1.2 to 3.5 wt. %; for example, from 1.5 to 3.0 wt. %; for example, from 1.8 to 2.8 wt. %. For example, component C is present in a content ranging of at least 1.0 wt. % based on the total weight of the composite material; for example; of at least 1.2 wt. %; for example, of at least 1.5 wt. %; for example, of at least 1.8 wt. %. For example, component C is present in a content ranging of at most 4.5 wt. % based on the total weight of the composite material; for example, of at most 4.0 wt. %; for example, of at most 3.5 wt. %; for example, of at most 3.0 wt. %; for example, of at most 2.8 wt. %.

For example, the one or more dispersants are selected from fatty acids, fatty acid derivatives, ethylene bis stearamide, functionalized waxes, maleic anhydride-grafted polymers and any mixture thereof. For example, the one or more dispersants are selected from fatty acids, fatty acid derivatives, ethylene bis stearamide, maleic anhydride-grafted polymers and any mixture thereof. For example, the one or more dispersants are selected from fatty acids, fatty acid derivatives, ethylene bis stearamide, functionalized waxes and any mixture thereof. For example, the one or more dispersants are selected from fatty acids, fatty acid derivatives ethylene bis stearamide, and any mixture thereof; more preferably from fatty acids and/or ethylene bis stearamide.

For example, the one or more dispersants are or comprise fatty acids being saturated fatty acids and/or unsaturated fatty acids. For example, the one or more dispersants are or comprise saturated fatty acids. For example, one or more dispersants are or comprise at least one fatty acid selected from stearic acid, palmitic acid, myristic acid, lauric acid, oleic acid, arachidic acid, erucic acid, behenic acid and any mixture thereof.

For example, the one or more dispersants are or comprise fatty acids having a number of carbon atoms ranging from 6 to 24, preferably from 12 to 22.

For example, the one or more dispersants are or comprise at least one fatty acid derivative selected from a salt of fatty acid, an ester of fatty acid, a carboxylate of fatty acid and any mixture thereof.

For example, the one or more dispersants are or comprise at least one fatty acid derivative selected from methyl stearate, lithium stearate, sodium stearate, magnesium stearate, calcium stearate, barium stearate, zinc stearate, aluminium stearate and any mixture thereof.

For example, the one or more dispersants are or comprise at least one fatty acid derivative being glycerol monostearate.

For example, the one or more dispersants are or comprise at least one functionalized wax selected from functionalized paraffin wax, functionalized polyethylene wax, functionalized polypropylene wax and mixtures thereof. For example, the functionalized waxes comprise an acid function or an anhydride function such as a maleic anhydride function.

For example, the one or more dispersants are or comprise at least ethylene bis stearamide (EBS—CAS Registry Number: 110-30-5) and/or its derivatives.

For example, the one or more dispersants are or comprise at least one maleic anhydride-grafted polymers selected from Polyethylene-graft-maleic anhydride (PE-g-MA), Polypropylene-graft-maleic anhydride (PP-g-MA), Styrene-Ethylene/Butylene-Styrene-maleic anhydride-graft (SEBS-g-MA), and any mixtures thereof.

The Optional Component D being at Least One Filler

The composite material may further comprise from 0 to 50.0 wt. % of component D being at least one filler based on the total weight of the composite material; preferably from 0.1 to 50.0 wt. %, more preferably from 0.2 wt. % to 40.0 wt. %, even more preferably from 0.5 wt. % to 30.0 wt. %, most preferably from 1.0 wt. % to 20 wt. %, even most preferably from 1.5 wt. % to 15.0 wt. %, or from 2.5 wt. % to 12.5 wt. %, or from 5.0 wt. % to 10.0 wt. %, or from 5.0 wt. % to 15 wt. % or from 7.0 wt. % to 15 wt. %.

In an embodiment, the composite material comprises at least 0.1 wt. % of at least one filler, as based on the total weight of the composite material, preferably at least 0.5 wt. %, more preferably at least 1.0 wt. %, even more preferably of at least 1.5 wt. %, most preferably at least 2.5 wt. % and even most preferably at least 5.0 wt. %, or at least 7.0 wt. %.

With preference, the composite material comprises at most 50.0 wt. % or at most 40.0 wt. % of at least one filler, as based on the total weight of the at least one filler, preferably at most 30 wt. %, more preferably at most 20 wt. %, even more preferably at most 15 wt. %, most preferably at most 12.5 wt. % or at most 10.0 wt. %.

With preference, the at least one filler is at least one reinforcement material selected from carbon black, carbon fibers, carbon nanotubes, talc mineral filler, wollastonite, calcium carbonate, modified calcium carbonate, coated calcium carbonate, glass fibres, bamboo fibres, flax fibres, hemp fibres, and any mixture thereof.

Examples of talc that can be used according to the present disclosure are talc filler Finntalc MO5SL and Finntalc M15, both manufactured and sold by Mondo Minerals (CAS-No. 14807-96-6). Finntalc MO5SL has a median particle size (d50) of 2.2 µm. Finntalc M15 has a median particle size (d50) of 4.5 µm.

For example, the at least one filler comprises at least one reinforcement material selected from talc mineral filler, wollastonite, calcium carbonate, modified calcium carbonate, coated calcium carbonate, glass fibres, bamboo fibres, flax fibres, hemp fibres, and any mixture thereof. With preference, the at least one filler is or comprises talc.

The Optional Component E being at Least One Elastomer

In a preferred embodiment, to enhance the impact properties, the composite material may comprise component E being at least one elastomer.

The component E, when present, is preferably selected from copolymers of ethylene with a $C_3$-$C_{10}$ α-olefin containing at least 20 wt %, preferably from 20 to 70 wt. %, of $C_3$-$C_{10}$ α-olefin ($^{13}$C-NMR analysis). Suitable and preferred copolymers that can be used as component E commercially available are obtained with metallocene or constrained geometry catalyst and typically have molecular weight distribution (Mw/Mn measured via GPC) ranging from 1 to 3.

With preference, component E is selected from elastomeric copolymers of ethylene with 1-octene, elastomeric copolymers of ethylene with 1-butene and any mixture thereof.

For example, component E is selected from:
elastomeric copolymers of ethylene with 1-octene having from 20 wt. % to 45 wt. % of 1-octene ($^{13}$C-NMR analysis); and/or
elastomeric thermoplastic copolymers of ethylene with 1-butene having from 20 wt. % to 40 wt. % of 1-butene ($^{13}$C-NMR analysis); and/or
elastomeric thermoplastic copolymers of ethylene with propene.

Non-exhaustive specific examples of elastomer that can be used in the process according to the disclosure are:
a) an ethylene-butene-1 random copolymer rubber such as:
ENGAGE 7642 produced by The Dow Chemical Co. Ltd., having an MI2 of 0.5 g/10 min.
ENGAGE 7447 produced by The Dow Chemical Co. Ltd., having an MI2 of 5.0 g/10 min.
ENGAGE 7467 produced by The Dow Chemical Co. Ltd., having an MI2 of 1.2 g/10 min.
Tafmer A0550S from Mitsui having an MI2 of 0.5 g/10 min.
Tafmer A1550S from Mitsui having an MI2 of 1.0 g/10 min.
Lucene 168 from LG having an MI2 of 1.2 g/10 min.
Lucene 175 from LG having an MI2 of 1.2 g/10 min.
Lucene 565 from LG having an MI2 of 1.2 g/10 min.
b) an ethylene-octene-1 random copolymer rubber such as:
Affinity EG8100 from The Dow Chemical Co. Ltd., having an MI2 of 1.0 g/10 min.
Affinity EG8150 from The Dow Chemical Co. Ltd., having an MI2 of 0.5 g/10 min.
c) an ethylene-propylene copolymer rubber such as:
Exxon IT0316 from ExxonMobil, having an ethylene content of 16 wt. %.

For the cited elastomers, the MI2 was determined according to ISO 1133 (190° C./2.16 Kg).

In an embodiment, alternative or cumulative, the composite material further comprises from 0.1 to 15 wt. %, as based on the total weight of the composite material of one or more styrene-based thermoplastic elastomers (TPE-S) selected from SIS (Styrene isoprene styrene block copolymers), SEPS (Hydrogenated Styrene isoprene styrene block copolymers), SBS (Styrene butadiene styrene block copolymers), SEBS (Hydrogenated styrenic butadiene copolymers), SBSS (Styrene butadiene styrene styrene block copolymers), and any mixture thereof.

Preferably, the composite material comprises at least 0.1 wt. % of TPE-S, as based on the total weight of the composite material, preferably at least 0.5 wt. %, more preferably at least 1.0 wt %, even more preferably of at least 1.5 wt. %, most preferably at least 2.5 wt. % and even most preferably at least 5.0 wt. %.

With preference, the composite material comprises at most 9.8 wt. % of TPE-S, as based on the total weight of the composite material, preferably at most 9.5 wt. %, more preferably at most 9.3 wt. %, even more preferably at most 9.1 wt. %, most preferably at most 9.0 wt. %, and even most preferably at most 8.5 wt. %.

In a preferred embodiment, the composite material comprises from 0.1 to 9.8 wt. % of TPE-S as based on the total weight of the composite material, preferably from 0.5 to 9.5 wt. %, more preferably from 1.0 to 9.3 wt. %, even more preferably from 1.5 to 9.1 wt. %, most preferably from 2.5 to 9.0 wt. % and even most preferably from 5.0 to 8.5 wt. %.

Component E has an MI2 ranging from 0.5 to 5.0 g/10 min as determined according to ISO 1133 conditions D, at a temperature of 190° C. and under a load of 2.16 kg.

With preference, component E has an MI2 of at most 4.5 g/10 min as determined according to ISO 1133 conditions D, at a temperature of 190° C. and under a load of 2.16 kg, preferably of at most 4.0 g/10 min, more preferably of at most 3.5 g/10 min, even more preferably of at most 3.0 g/10 min, most preferably of at most 2.5 g/10 min and even most preferably of at most 2.0 g/10 min.

For example, the composite material comprises from 0 to 30.0 wt. % of component E (i.e. one or more elastomers) based on the total weight of the composite material, preferably from 0.1 to 30.0 wt. % or from 0.1 to 25.0 wt. %. For example, the composite material comprises from 1.0 to 20.0 wt. % of component E based on the total weight of the composite material; preferably from 3.0 to 15.0 wt. %; more preferably from 5.0 to 10.0 wt. %.

The EMI Shield Article Produced from the Composite Material

The EMI shield article made from the composite material of the disclosure can be used, for example, in the passenger compartment of a motor vehicle, such as a car, a bus or a truck.

The EMI shield article is an injected article and/or it is a panel with thickness ranging from 1.0 to 2.0 mm.

The disclosure also encompasses the use of a composite material in an EMI shield article wherein composite material is according to the disclosure; with preference, EMI shield article is a panel having a thickness ranging from 1.0 to 2.0 mm.

It may be interesting to reduce the content of volatile organic compounds (VOC) coming from the one or more post-consumer resins. Indeed, odour is one of the problems commonly encountered with the use of post-consumer resins. Performing such a heating step allows introducing post-consumer resins in the passenger compartment of a motor vehicle, such as a car, a bus or a truck, without negatively affecting the comfort of the users of the said motor vehicle.

Therefore, in one or more embodiments, the use of a composite material in an EMI shield panel, when component A comprises a post-consumer resin; comprises heating the EMI shield panel for a time of at least 1 min at a temperature ranging:
from Tm-70° C. to Tm-20° C. when component A is one or more semi-crystalline polymers selected from polyethylene and/or polypropylene, wherein Tm is the melting temperature of component A; or
from Tg-50° C. to Tg-10° C. when component A is one or more amorphous polymers wherein Tg is the glass transition temperature of component A.

For example, the heating step is conducted for a time sufficient to result in the odour being improved as measured through the short-chain content (volatiles) by a thermodesorption analysis (TDA) coupled with a chromatography analysis.

For example, the EMI shield article has a thickness ranging from 0.5 to 3.0 mm; with preference, from 1.0 to 2.0 mm.

For example, the EMI shield panel has a shielding of at least 40 dB as determined using a coaxial measurement cell at a frequency ranging from 0.1 MHz to 20 GHz when moulded to form a plaque having a thickness ranging from 1 to 2 mm.; with preference a shielding of at least 50 dB and/or at a frequency ranging from 0.1 MHz to 18 GHz, more preferably 0.1 MHz to 8 GHz or from 0.1 MHz to 5 GHz, or from 0.1 MHz to 1 GHz; for example, from 1 to 18 GHz. or from 8 to 18 GHz.

For example, the composite material or the blend of components A, B and C has a density ranging from 0.8 to 1.8 g/cc as determined by Hydrostatic weighing (immersion) according to ISO 1183; for example, from 0.9 to 1.6 g/cc; for example, from 0.9 to 1.5 g/cc; for example, from 0.9 to 1.4 g/cc; for example, from 1.0 to 1.3 g/cc.

Test Methods

The melt index MI2 of the polypropylene is determined according to ISO 1133 at 230° C. under a load of 2.16 kg.

The melt flow index MI2 of the polyethylene is determined according to ISO 1133 at 190° C. under a load of 2.16 kg.

The melt flow index MFI of the amorphous polymer such as the polystyrene is determined according to ISO 1133 at 200° C. under a load of 5 kg.

The glass transition temperature (Tg) is determined according to ISO 11357-2:2013.

Molecular weights are determined by Size Exclusion Chromatography (SEC) at high temperature (145° C.). A 10 mg polypropylene sample is dissolved at 160° C. in 10 mL of trichlorobenzene (technical grade) for 1 hour. Analytical conditions for the GPC-IR from Polymer Char are:
Injection volume: +/−0.4 mL;
Automatic sample preparation and injector temperature: 160° C.;
Column temperature: 145° C.;
Detector temperature: 160° C.;
Column set: 2 Shodex AT-806MS and 1 Styragel HT6E;
Flow rate: 1 mL/min;
Detector: IR5 Infrared detector (2800-3000 cm$^{-1}$);
Calibration: Narrow standards of polystyrene (commercially available);
Calculation for polypropylene: Based on Mark-Houwink relation ($\log_{10}(M_{PP})=\log_{10}(M_{PS})-0.25323$); cut off on the low molecular weight end at $M_{PP}=1000$;
Calculation for polyethylene: Based on Mark-Houwink relation ($\log_{10}(M_{PE})=0.965909 \log_{10}(M_{PS})-0.28264$); cut off on the low molecular weight end at $M_{PE}=1000$.

The molecular weight averages used in establishing molecular weight/property relationships are the number average ($M_n$), weight average ($M_w$) and z average ($M_z$) molecular weight. These averages are defined by the following expressions and are determined from the calculated $M_i$:

$$M_n = \frac{\sum_i N_i M_i}{\sum_i N_i} = \frac{\sum_i W_i}{\sum_i W_i/M_i} = \frac{\sum_i h_i}{\sum_i h_i/M_i}$$

$$M_w = \frac{\sum_i N_i M_i^2}{\sum_i N_i M_i} = \frac{\sum_i W_i M_i}{\sum_i M_i} = \frac{\sum_i h_i M_i}{\sum_i M_i}$$

$$M_z = \frac{\sum_i N_i M_i^3}{\sum_i N_i M_i^2} = \frac{\sum_i W_i M_i^2}{\sum_i W_i M_i} = \frac{\sum_i h_i M_i^2}{\sum_i h_i M_i}$$

Here $N_i$ and $W_i$ are the number and weight, respectively, of molecules having molecular weight Mi. The third representation in each case (farthest right) defines how one obtains these averages from SEC chromatograms. $h_i$ is the height (from baseline) of the SEC curve at the $i_{th}$ elution fraction and $M_i$ is the molecular weight of species eluting at this increment.

The molecular weight distribution (MWD) is then calculated as Mw/Mn.

The $^{13}$C-NMR analysis is performed using a 400 MHz or 500 MHz Bruker NMR spectrometer under conditions such that the signal intensity in the spectrum is directly proportional to the total number of contributing carbon atoms in the sample. Such conditions are well-known to the skilled person and include, for example, sufficient relaxation time etc. In practice, the intensity of a signal is obtained from its integral, i.e. the corresponding area. The data are acquired using proton decoupling, 2000 to 4000 scans per spectrum with 10 mm room temperature through or 240 scans per spectrum with a 10 mm cryoprobe, a pulse repetition delay of 11 seconds and a spectral width of 25000 Hz (+/−3000 Hz). The sample is prepared by dissolving a sufficient amount of polymer in 1,2,4-trichlorobenzene (TCB, 99%, spectroscopic grade) at 130° C. and occasional agitation to homogenize the sample, followed by the addition of hexadeuterobenzene ($C_6D_6$, spectroscopic grade) and a minor amount of hexamethyldisiloxane (HMDS, 99.5+%), with HMDS serving as an internal standard. To give an example, about 200 mg to 600 mg of polymer is dissolved in 2.0 mL of TCB, followed by addition of 0.5 mL of $C_6D_6$ and 2 to 3 drops of HMDS.

Following data acquisition, the chemical shifts are referenced to the signal of the internal standard HMDS, which is assigned a value of 2.03 ppm.

The comonomer content in polypropylene or polyethylene is determined by $^{13}$C-NMR analysis of pellets according to the method described by G. J. Ray et al. in Macromolecules, vol. 10, no 4, 1977, p. 773-778.

The isotacticity is determined by $^{13}$C-NMR analysis on the total polymer. In the spectral region of the methyl groups, the signals corresponding to the pentads mmmm, mmmr, mmrr and mrrm are assigned using published data, for example, A. Razavi, Macromol. Symp., vol. 89, pages 345-367. Only the pentads mmmm, mmmr, mmrr and mrrm are taken into consideration due to the weak intensity of the signals corresponding to the remaining pentads. For the signal relating to the mmrr pentad, a correction is performed for its overlap with a methyl signal related to 2,1-insertions. The percentage of mmmm pentads is then calculated according to % mmmm=AREA$_{mmmm}$/(AREA$_{mmmm}$+AREA$_{mmmr}$+AREA$_{mmrr}$+AREA$_{mrrm}$)·100

Melting temperatures Tm were determined according to ISO 11357-3:2018 on a DSC Q2000 instrument by TA Instruments. To erase the thermal history the samples are first heated to 200° C. and kept at 200° C. for 3 minutes. The reported melting temperatures Tm are then determined with heating and cooling rates of 20° C./min.

The density of polymer or polymer compound is determined according to ISO 1183 at a temperature of 23° C.

Density of fibers (like silver-coated glass fibres presented in the examples) is measured using a Quantachrome Ultrapyc 1200e pycnometer.
  The temperature of the pycnometer is controlled thanks to an external water bath regulated at 23° C.;
  The procedure is: A sample is precisely weighted (precision 10-6 g) then introduced in the pycnometer. Inside the pycnometer, the volume of the sample is determined using helium at a pressure of 17 psi: 10 volume measurements are performed; the reported value is the average value based on the three closest measurements;

The density is calculated as the weight (in g) divided by the volume (in cm$^3$);

Practically, when powder of fibers are considered, to avoid fouling of the pycnometer, a two-step procedure is considered:

Determination of the weight and the volume of 4 small capsules (with perforated lid) normally used for DSC (Differential Scanning calorimetry) analysis;

Determination of the weight and the volume of the 4 small capsules (+perforated lid) after filling the capsule with fibres;

From obtained results, the weight and the volume of the fibres are calculated and used to determine the density.

The content of carbon nanotubes in percentage by weight in blends (% CNT) can be determined by thermal gravimetric analysis (TGA) according to ISO 11358, using a Mettler Toledo STAR TGA/DSC 1 apparatus. Before the determination of the content of carbon nanotubes in % by weight in blends (% CNT), the carbon content of the carbon nanotubes in % by weight (% C-CNT) was determined as follows: 2 to 3 milligrams of carbon nanotubes were placed into a TGA. The material was heated at a rate of 20° C./min from 30° C. to 600° C. in nitrogen (100 ml/min). At 600° C., the gas was switched to air (100 ml/min), and the carbon oxidized, yielding the carbon content of the carbon nanotubes in % by weight (% C-CNT). The % C-CNT value was the average of 3 measurements. For the content of carbon nanotubes % by weight in blends (% CNT), 10 to 20 milligrams of sample was placed into a TGA. The material was heated at a rate of 20° C./min from 30° C. to 600° C. in nitrogen (100 ml/min). At 600° C., the gas was switched to air (100 ml/min), and the carbon oxidized, yielding to the carbon content of carbon nanotubes in the sample (% C-sample). The % C-sample value was the average of 3 measurements. The content of carbon nanotubes in % by weight in the sample (% CNT) was then determined by dividing the carbon content of carbon nanotubes in % by weight in samples (% C-sample) by the carbon content of the carbon nanotubes in % by weight (% C-CNT) and multiplying by 100.

% CNT=% C-sample/% C-CNT*100

Determination of the volatiles organic content by thermal desorption analysis (TDA) coupled with gas chromatography (GC).

The polymer sample (40 to 60 mg) is introduced in an ATD/GC equipment (Automatic Thermal Desorber) with FID (flame ionization detector) detection for the quantitative analysis.

In this analysis, a thermal desorption process is imposed on the polymer sample during 15 minutes at 150° C. in an oven. Volatile organic compounds are extracted from the sample by an imposed helium flux and are captured in an adsorbent cartridge TENAX cooled at −30° C.

In a second process, volatile compounds are injected in a chromatographic separation column via a rapid heating process of the cartridge at 230° C. The analytes are separated onto the column before being detected by FID.

Results: The compounds are identified based on their retention times in comparison with previously determined retention times of n-paraffins, in the same experimental conditions. The quantification of the components is performed using an external calibration curve (linear) established using 1-hexene as reference.

Chromatographic Analysis Conditions:
  Capillary column: type: HP-5
    Length: 60 m
    Internal diameter: 0.32 mm
    Phase type: 5% Ph-Me-siloxane
    Phase thickness: 1 µm
  Detector type: F.I.D
    Temperature: 280° C.
    Air flow: 450 ml/min
    Hydrogen flow: 40 ml/min
    Flow make up: 30 ml/min (constant)
  GC oven programmation: Isothermal temperature 1: 45° C.
    Isothermal time 1: 15 minutes
    Heating rate: 5° C./min
    Isothermal temperature 2: 280° C.
    Isothermal time 2: 25 min. or 5 min. for the calibration line ATD Conditions
  Thermo desorption equipment: TurboMatrix ATD from Perkin Elmer
  Oven temperature: 150° C.
  Desorption time: 15 minutes.
  Trap temperature: Low temperature: −30° C. (trapping mode)
    High temperature: 230° C. (desorption mode)
  Desorption time of the trap: 10 minutes
  Trap heating rate: 99° C./s
  Temperature of the transfer line: 250° C.
  Valve block temperature: 200° C.
  Carrier gas pressure: 0.086 MPa
  Inlet split flow: 37 ml/min
  Outlet split flow: 16.5 ml/min
  Desorption flow: 20 ml/min
  Considered mode: MS
  Purge time: 1 minute
  Run time: 79 minutes (32 minutes for the calibration line)

Electromagnetic shielding was measured using a coaxial measurement cell in the 0.1 MHz-8 GHz frequency range and two waveguide measurement cells in the 8.2-18 GHz frequency range.

With the coaxial cell (0.1 MHz-8 GHz), the measurement method is inspired by the ASTM D4935-18 Standard Test Method for Measuring the Electromagnetic Shielding Effectiveness of Planar Materials. The samples are hot pressed disc of 24 mm diameter and 1 mm thickness. A 3 mm hole is drilled in the middle of the disc. Both face of the disc are gold metallized for 10 mins except a ring centered on the central hole (small metallic ring used as mask) using a Cressington sputter coater 108 auto (pressure 0.1 mbar, intensity 40 mA). The inner diameter of the ring is 6 mm and the outer diameter in 13 mm. The Anritsu Shockline 2 ports VNA (MS 46522B) is calibrated using a Anritsu TOSLKF50A-20, type K(f), DC to 20 GHz, 50 Ohms calibration kit (open, short, load on both port and thru). Calibration is done on the 50 kHz-10 GHz frequency range. VNA power is set to 0 dBm which corresponds to 1 mW, IFBW is set to 100 Hz and 801 points regularly spaced over the frequency logarithmic scale are measured. The measured data is the average of 3 measurements and a smoothing of 2% is applied (smoothing over 7 frequency neighbouring points). Before sample measurement, the EpsiMu Multiwave PE 13 mm coaxial measurement cell is measured empty. A metallized sample is inserted in the sample holder, the cell is closed tight and connected to the 2 ports of the VNA through coaxial cables. The 0.1 MHz-8 GHz frequency range is extracted from the experimental data and the empty coaxial cell signal is subtracted from the sample data.

For one composite composition, four samples are measured and the final result is the average of the four measurements (eventual error bars are the standard deviations over the four measurements).

The scheme of the coaxial cell used to measure shielding in the 0.1 MHz-8 GHz frequency range is depicted in FIG. 1.

With the two waveguides (8.2-18 GHz), the measurement method is inspired by the 299.1-2013—IEEE Standard Method for Measuring the Shielding Effectiveness of Enclosures and Boxes Having all Dimensions between 0.1 m and 2 m. Samples are hot-pressed plaques of 1 mm thickness and cut so they fit in the waveguides. The Anritsu Shockline 2 ports VNA (MS 46522B) is calibrated using an Anritsu TOSLKF50A-20, type K(f), DC to 20 GHz, 50 Ohms calibration kit (open, short, load on both port and thru). Calibration is done on the 8 GHz-20 GHz frequency range. VNA power is set to 0 dBm which corresponds to 1 mW, IFBW is set to 100 Hz and 401 points regularly spaced over the frequency linear scale are measured. The measured data is the average of 3 measurements and a smoothing of 5% is applied (smoothing over 19 frequency neighboring points). To measure the 8.2-12.4 GHz frequency range (X band) and the 12.4-18 GHz frequency range (Ku band), are respectively used a Pasternack PE-W90S001-6 1701 waveguide and a PE-W62S001-6 1650 waveguide. One of the waveguide is connected to the VNA through coaxial cables and, before samples measurement, the empty waveguides are measured. A cut sample is inserted in the waveguide perpendicularly so that it blocks completely the connection between the cavities of the two parts of the waveguide. The waveguide corresponding frequency range is extracted from the experimental data and the empty waveguide signal is subtracted from the sample data. For one composite composition, four samples are measured and the final result is the average of the four measurements (eventual error bars are the standard deviations over the four measurements). The two waveguides data are reassembled in order to display shielding over the whole 8.2-18 GHz frequency range.

EXAMPLES

The following non-limiting examples illustrate the disclosure.

Example 1: Preparation of the Composite Materials

Composite material with metal-coated particles was produced wherein:
  Component A used was a polypropylene PPH 7060 commercially available from TOTAL®, the polypropylene is a homopolymer having an MFI of 12 g/10 min as determined by ISO1133 (230° C.-2.16 kg/10 min).
  Component B was silver-coated glass fibres with an average length of 180 μm and an average diameter of 15 μm. The average density was 3.1 g/cc. The silver content is about 20 wt. % based on the total weight of the fibres and the silver layer is nanometric. The silver-coated glass fibres were commercially available from Hart Materials UK.
  optional component C being stearic acid. The stearic acid used was commercially available from Sigma-Aldrich Merck France (>95% purity grade).
When component C is added, the composite material is according to the disclosure. In the absence of component C, the composite material is comparative.

Comparative composite materials were also produced wherein component A being polypropylene PPH 7060 and electrically conductive particles, alternative to component B, being metal particles. In specie, the metal particles were tin particles commercially available from GoodFellow under the reference SN006020 with an average diameter of 45 μm.

Other comparative composite materials were produced wherein component A being polypropylene PPH 7060 and electrically conductive particles, alternative to component B, being carbon nanotubes. The CNT used were Nanocyl™ NC 7000 available from Nanocyl.

The composite materials were prepared with an internal mixer from Haake Thermo Fisher equipped with a 75 mm$^3$ tank. The mixture was produced for the silver glass fibres at 200° C., 50 rpm for 10 mins. For the tin particles, since their melting temperature is 231° C., the mixing was carried out at 190° C., 30 rpm for 8 mins then 50 rpm for 2 mins (to avoid friction heating between the particles). The mixture is then cooled with liquid nitrogen and then ground into 1 mm pellets in a Pulverisette 19 knife mill. From the pellets, samples for shielding measurements are carried out in a hot press with pressure rising up to 25 MPa at a temperature of 190° C. for tin particles-containing composite material and 200° C. for silver glass fibres-containing composite material.

Electrical contacts between the sample and the measurement cell are gold metallized for 600 s in a Cressington Sputter Coater 108 auto. Distance from the electrode was 5 cm, chamber pressure was $1.10^{-5}$ MPa (0.1 mbar) and intensity was 40 mA.

The electromagnetic shielding is measured using an Anritsu Shockline MS 46522B 2-port network vector analyzer (VNA). The measuring cells used are an Epsimu Multiwave PE 13 mm coaxial cell which can carry out shielding measurements between 50 kHz and 8 GHz, and two waveguide cells Pasternack PE-W90S001-6 1701 and PE-W62S001-6 1650 which can respectively carry out shielding measurements between 8.2 and 12.4 GHz, and 12.4 and 18 GHz. The maximum sensitivity of the VNA coupled to this measurement cell is approximately 100 dB. Before each series of measurements, the VNA is calibrated and the cell is measured when empty to ensure that it has 0 dB shielding. The measurement power is fixed at 0 dBm or 1 mW. The formula for electromagnetic shielding is as follows:

$$SE = -20 \cdot (Ei/Et) = -10 \cdot \log(Pi/Pt)$$

Ei and Pi are the amplitude and the incident wave power (which arrives on the sample), Et and Pt are the same quantities transmitted through the sample. Thus, when the shielding is dB, 90% of the power of the incident wave is blocked by the sample; at 20 dB, 99%; at 30 dB, 99.9%; and at 40 dB, 99.99%. It is this latter value that constitutes the target shielding.

Without going into theoretical details, important parameters to consider for electromagnetic shielding are the material electrical conductivity (among others), the sample thickness and the incident wave frequency. In general, apart from a few exceptions, shielding tends to increases whenever one of these three parameters increases.

The results are provided in table 1

|  | S1 | S2 | S3 | S4 | S5 | S6 |
| --- | --- | --- | --- | --- | --- | --- |
| Comp B | FVAg | FVAg | Tin | Tin | CNT | CNT |
| Comp B (vol. %) | 10 | 10 | 30 | 30 | 4.8 | 5 |

-continued

|  | S1 | S2 | S3 | S4 | S5 | S6 |
|---|---|---|---|---|---|---|
| Comp B (wt. %) | 25.6 | 25.6 | 78 | 77.5 | 10 | 10 |
| PP (wt. %) | 74.4 | 72.7 | 22 | 20.5 | 90 | 86.3 |
| stearic acid (vol. %) | — | 2 | — | 6 | — | 4 |
| stearic acid (wt. %) | — | 1.7 | — | 2 | — | 3.7 |
| Density (g/cc) | 1.09 | 1.1 | 2.82 | 2.82 | 0.96 | 0.96 |
| Shielding at 1 MHz (dB) | 38.6 | 48.8 | 47.3* | 74.6* | 28.8 | 22.8 |
| Shielding at 1 GHz (dB) | 34.4 | 60.7 | 45.4* | 91.2* | 31.6 | 24.3 |

*Samples with a thickness of 2 mm.

From the results, it can be seen that the best compromise between the EMI shielding and the density is achieved by the composite material containing silver glass fibres in the presence of stearic acid. With carbon nanotubes composites, even if composites densities remain decent, a shielding of 40 dB at 1 mm thickness was never surpassed without important drawbacks in processing and composite mechanical properties. The improvement of shielding properties in the presence of stearic acid for silver glass fiber composites was unexpected since, for carbon nanotubes, the addition of stearic acid brought no improvement of composite electromagnetic shielding properties (see S5 and S6). Comparing S1 and S2 it can be seen that at a similar filler volume concentration, the silver glass fibre composites display shielding values superior to 40 dB in the presence of stearic acid at 1 mm thickness, and the composites densities remain interesting. Tin composites display interesting shielding at 2 mm thickness but the density of the resulting composite is too high and involves an increase of the weight for the products made from the composite, which goes against the concern of lightening the weight of the vehicles to limit the production of greenhouse gases when they are driven.

Example 2: Effect of Stearic Acid (Component C) on the Electromagnetic Shielding Several composite materials being polypropylene-based composite material containing silver glass fibres were produced with different content of metal-coated particles (component B) and/or with different content of dispersant (i.e. component C).

The samples are polypropylene-based composite material prepared in the absence of acid stearic or the presence of acid stearic using the process of example 1. The mixing was done at 50 rpm.

The component A (i.e. PP) was polypropylene PPH 7060, component B (i.e. FVAg) was silver-coated glass fibres and component C was stearic acid.

Figure 2:
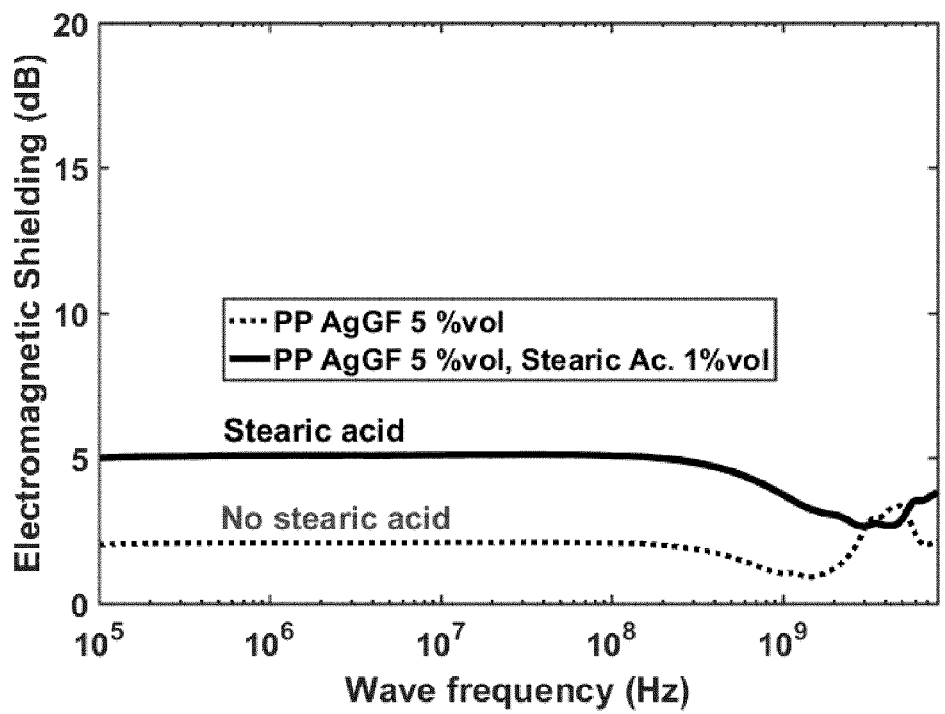
FIG. 2: Shielding as a function of the incident wave frequency for PP composites—Silver glass fibres at 5 vol. % of fibres, with and without stearic acid. Thickness 1 mm.
Figure 3:
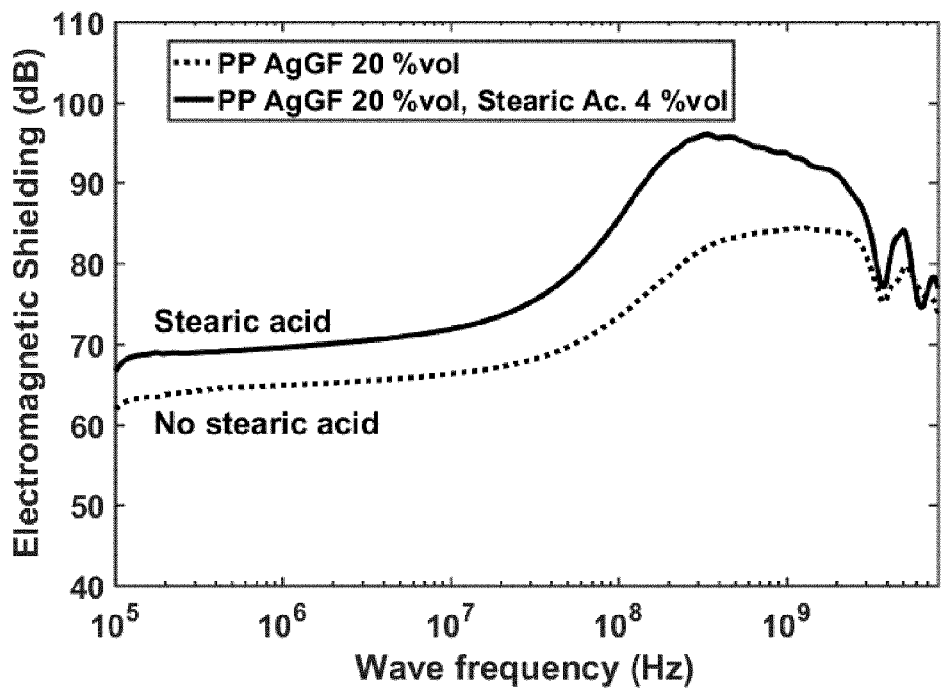
FIG. 3: Shielding as a function of the incident wave frequency for PP composites—Silver glass fibres at 20 vol. % of fibres, with and without stearic acid. Thickness 1 mm.

The results are shown in the below table 2 and FIGS. 1 to 3, the results of samples S1 and S2 have been reported to ease the comparison.

TABLE 2

|  | S7 | S1 | S8 | S9 | S2 | S10 | S11 |
|---|---|---|---|---|---|---|---|
| FVAg (vol. %) | 5 | 10 | 20 | 5 | 10 | 10 | 20 |
| FVAg (wt. %) | 14 | 25.6 | 43.6 | 14 | 25.6 | 25.6 | 43.6 |
| PP (wt. %) | 86 | 74.4 | 56.4 | 85.1 | 72.7 | 71 | 53.5 |
| stearic acid (vol. %) | — | — | — | 1 | 2 | 4 | 4 |
| stearic acid (wt. %) | — | — | — | 0.9 | 1.7 | 3.4 | 2.9 |
| Density (g/cc) | 1 | 1.09 | 1.28 | 1 | 1.1 | 1.1 | 1.29 |
| Shielding at 1 MHz (dB) | 2.1 | 38.6 | 64.9 | 5.1 | 48.8 | 43.4 | 69.5 |
| Shielding at 1 GHz (dB) | 1 | 34.4 | 84.3 | 3.7 | 60.7 | 47.4 | 93.6 |

Figure 4:
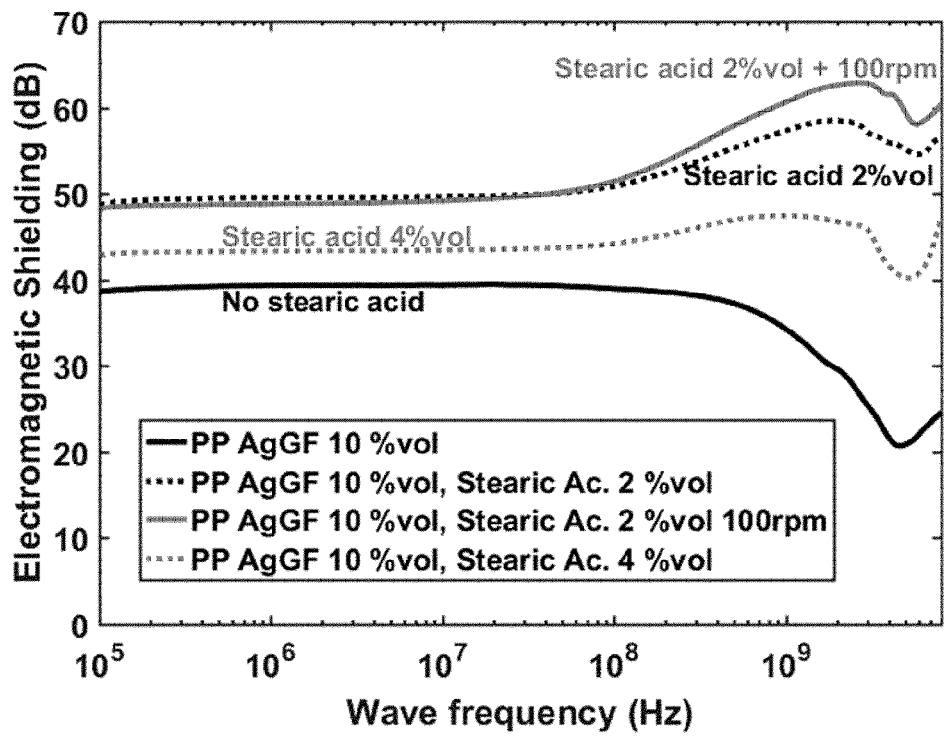
FIG. 4: Shielding as a function of the incident wave frequency for PP composites—silver glass fibres at 10 vol. % of fibres, with and without stearic acid (2 or 4 vol. %). The upper continuous curve is a composite with 2 vol. % stearic acid produced in a mixer at 100 rpm instead of 50 rpm. Thickness 1 mm.

At 5 vol. % of fibre (FIG. 2), the addition of stearic acid slightly increases the shielding but it remains very weak under the 5 dB. At 20 vol. % of fibre (FIG. 3), the addition of stearic acid also increases the shielding which goes from 65 to 70 dB at low frequency. At high frequency (>100 MHz), an impressive maximum value of 97 dB is reached at 300 MHz. For the 10 vol. % composite of silver glass fibres (FIG. 4), the addition of 2 vol. % stearic acid increases the shielding from 40 to 50 dB at low frequency. Also, the high-frequency shielding, instead of decreasing, increases and reaches a maximum value of 64 dB at 3 GHz. Adding stearic acid additional to 4 vol. % is harmful to the shielding, suggesting that there is an optimal amount of stearic acid.

These results show the great potential of PP composites—silver glass fibres and the positive effect of adding stearic acid. The target shielding of 40 dB at 1 mm sample thickness is reached and even exceeded from 10 vol. % of fibre with and without stearic acid and it can be expected to reach it for lower fibre concentrations in the presence of stearic acid. The great advantage of these composites is their low density due to the low concentration of fibres necessary to obtain a high shielding value and the low density of the fibres. Indeed, the density of the composite for 10 vol. % of fiber is equal to 1.09 g/cc and equal to 1.28 g/cc for 20 vol. % of fibre.

Figure 5:
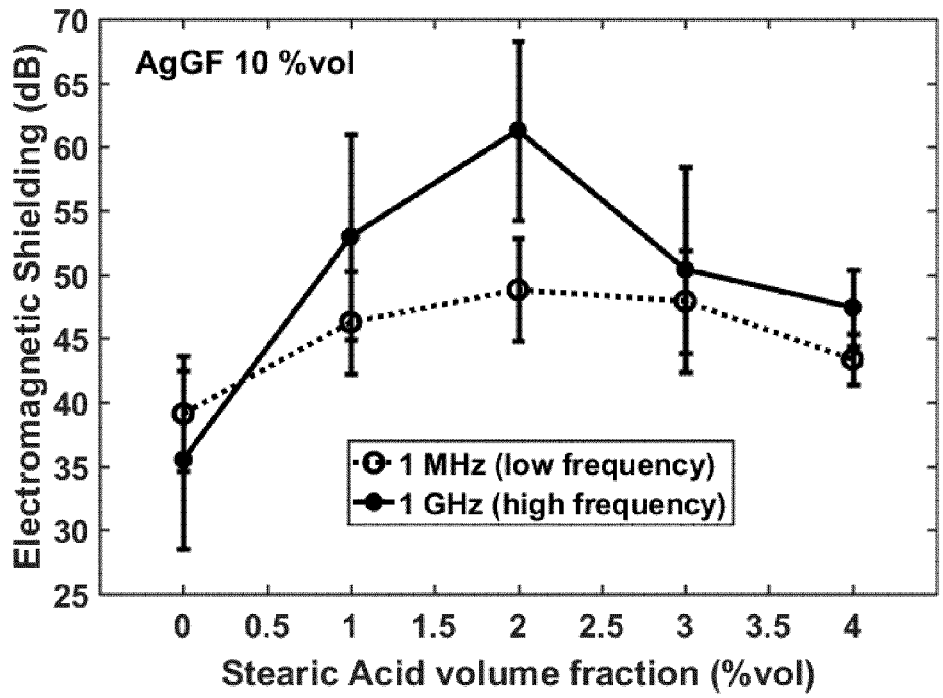
FIG. 5 is the shielding based on the amount of stearic acid for PP—silver glass fibers vol. % composites at two different incident wave frequencies. Thickness 1 mm.
Figure 6:
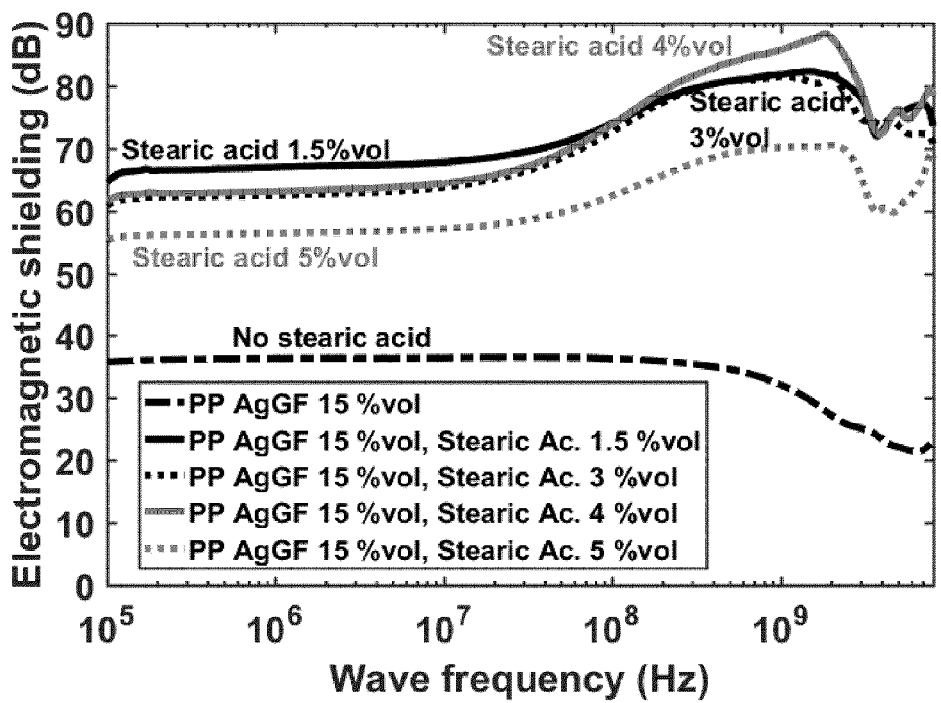
FIG. 6 is the shielding as a function of the incident wave frequency for PP composites—silver glass fibers at 15 vol. % of fibers, with different concentrations of stearic acid. Thickness 1 mm
Figure 7:
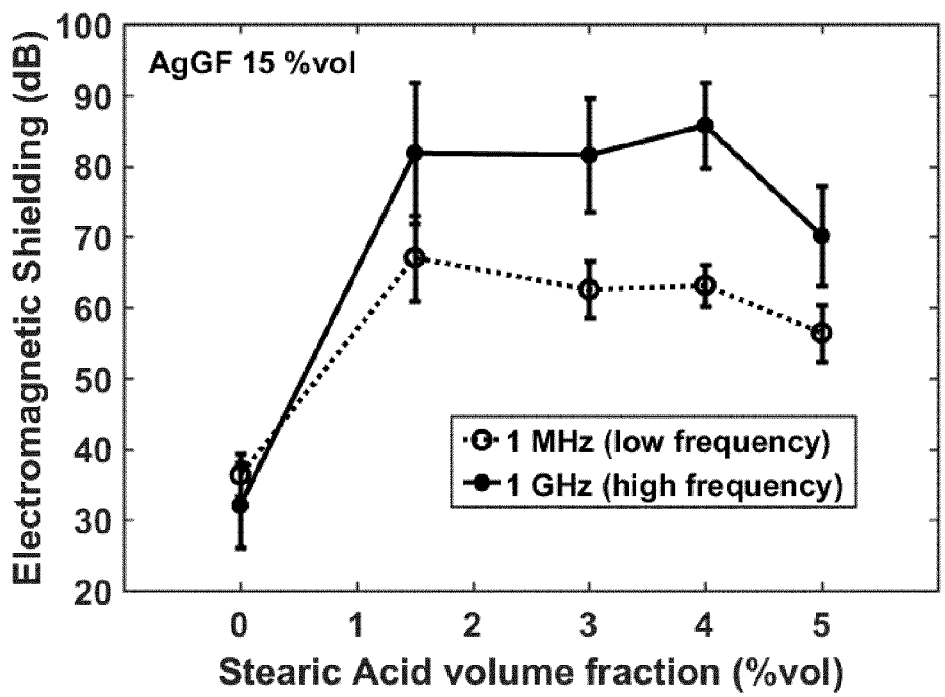
FIG. 7 is the shielding based on the amount of stearic acid for PP—silver glass fibers vol. % composites at two different incident wave frequencies. Thickness 1 mm.

The effect of the stearic acid concentration was further studied, the results are provided in FIG. 5, the content of fibres was 10 vol. % the thickness of the plate was 1 mm, and in FIGS. 6 and 7 wherein the content of fibres was 15 vol. %.

From the results, it can be seen that the shielding increases with the content of stearic acid up to about 2 vol. % of stearic acid (i.e. about 2 wt. %) and then start to decrease. The optimised range is, therefore, ranging from 1.5 to 4.0 wt. % of component C based on the total weight of the composite material, with preference from 1.5 to 3.0 wt. %.

Figure 8:
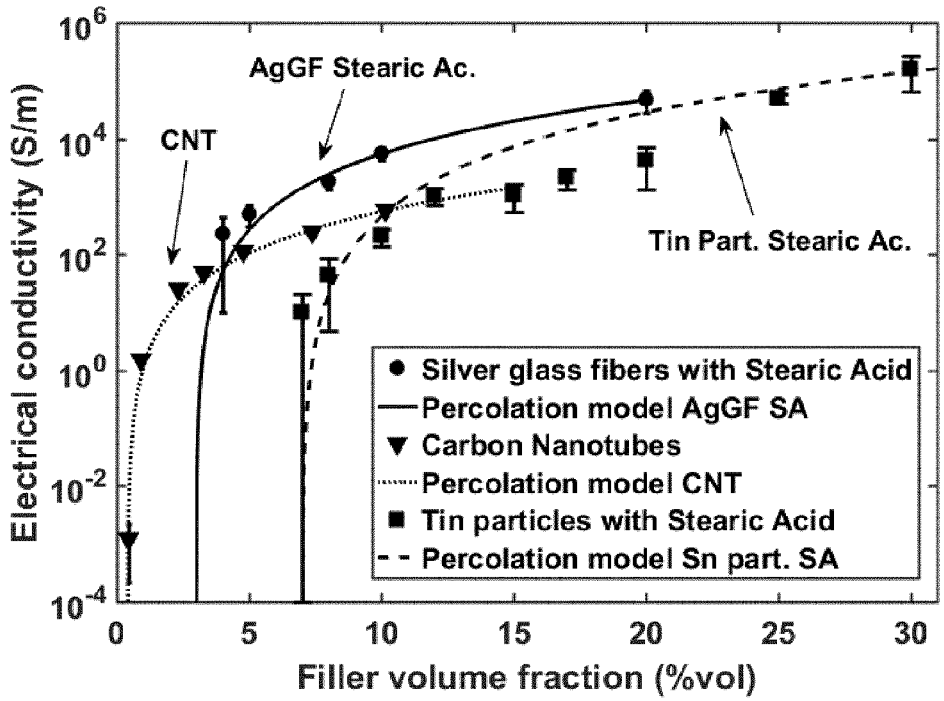
FIG. 8 is the electrical conductivity as a function of the filler volume fraction for different electroconductive particles.

Example 3: Effect of Stearic Acid (Component C) on the Percolation Threshold and the Electrical Conductivity The percolation threshold of the different electrically conductive fillers was studied in the absence or the presence of stearic acid. The results in the absence of stearic acid are reported in FIG. 8. From this figure, it can further be seen that the metal-coated particles tested (i.e. silver glass fibres) provide an electrical conductivity that is similar to the metal particle (i.e. tin particles) but with a lower percolation threshold. The carbon particle (i.e. CNT) shows lower electrical conductivity.

Figure 9:
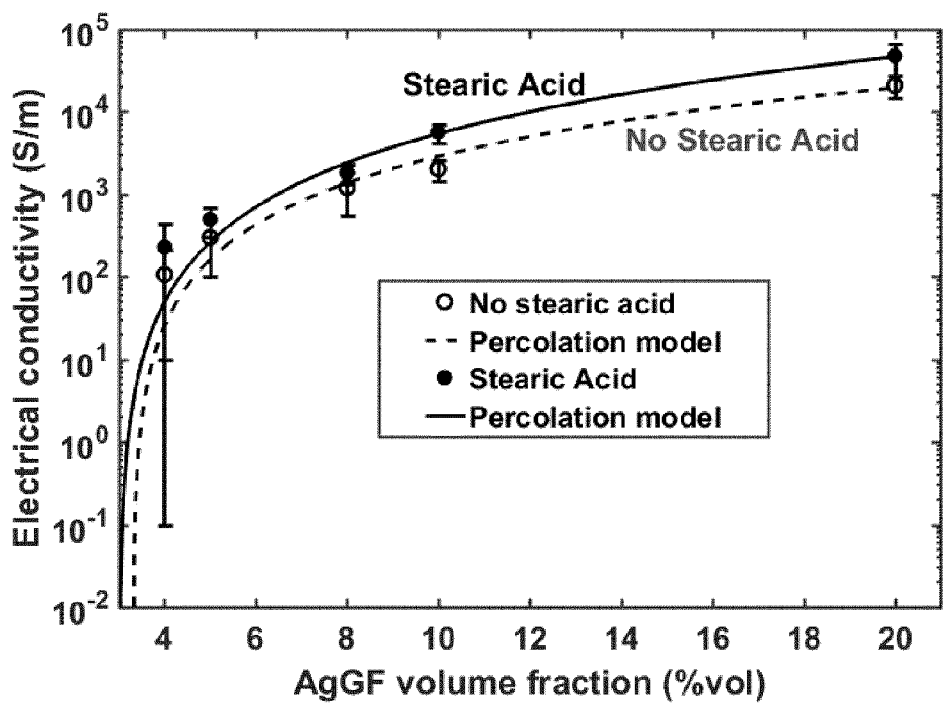
FIG. 9 is the electrical conductivity of composite material at different silver glass fibers volume fractions and in presence or absence of stearic acid.

FIG. 9 shows the effect of the presence of stearic acid on the electrical conductivity of the composite material containing silver glass fibres. It can be seen that the percolation threshold is lowered and at the same time the electrical conductivity is enhanced. Since stearic acid has no properties of electrical conduction a synergetic effect is therefore shown. The same effect was observed with tin particles but not with the CNT, suggesting that the synergetic effect occurs with metal or metal-coated particles only.

Example 4: Mechanical Properties

Traction tests were performed on Injected PP AgGF 10 vol. %, stearic acid 2 vol. %. Composite made in internal mixer 200° C., 100 rpm.

Injection conditions: 200° C., 6.5 MPa. Standard injected done bones for traction (50 mm length, 4 mm width, 2 mm thickness). For Young modulus determination, a traction test is done at 1 mm/min. For elongation and stress at break, elongation and stress at yield, traction tests are done at 10 mm/min. Seven samples were tested, the final result is the average of the seven tests and error bars are the standard deviation.

Results are compared with virgin PP 7060 and composite PP CNT 10 vol. %. The traction conditions are identical. For injection conditions, virgin PP 7060 is injected at 200° C., 5 MPa. PP CNT 10 vol. % is however injected at 250° C., 15 MPa.

Figure 10:
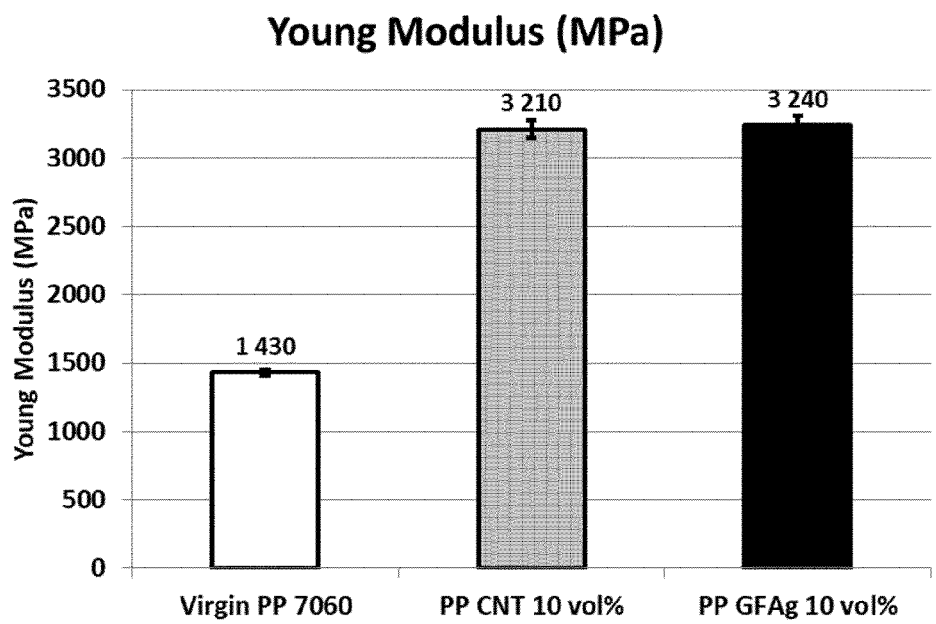
FIG. 10 shows the Young Modulus of virgin material compared to composites comprising either CNT or PP GFAg.
Figure 11:
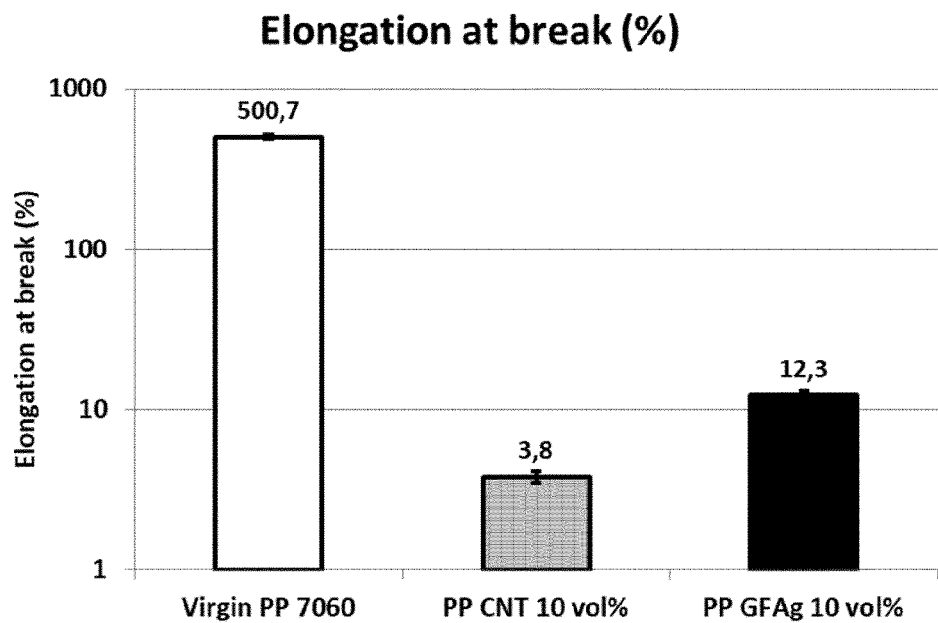
FIG. 11 shows the elongation at break of virgin material compared to composites comprising either CNT or PP GFAg.
Figure 12:
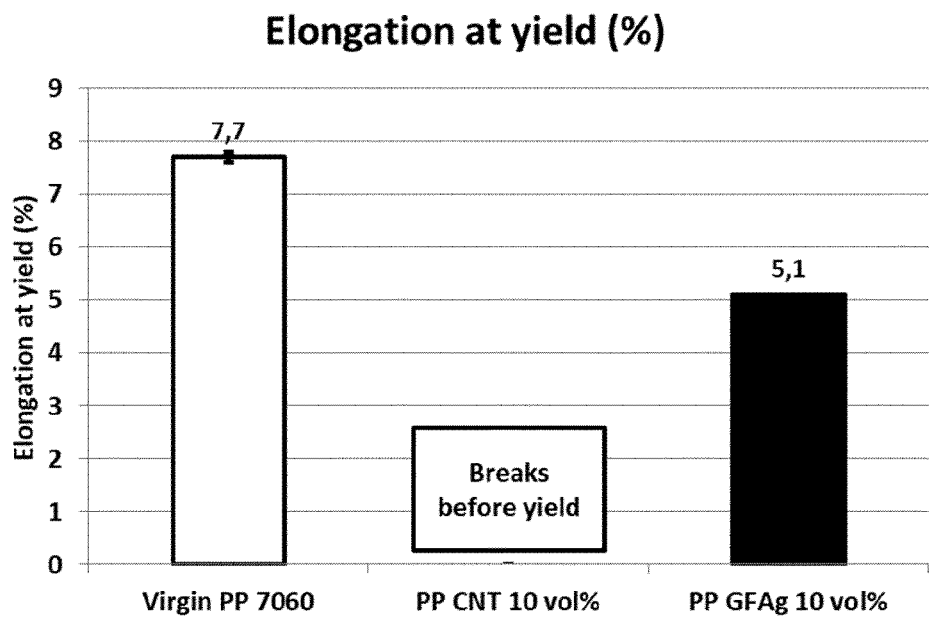
FIG. 12 shows the elongation at yield of virgin material compared to composites comprising either CNT or PP GFAg.

The results are provided in FIGS. 10 to 12. From the results of FIG. 10, it can be seen that both the PP CNT 10 vol. % and the PP AgGF 10 vol. % composites show an improved young modulus compared to the virgin resin. Carbon nanotubes and silver glass fibers are fillers having a comparable reinforcement effect for the same concentration on the PP composites.

The introduction of these fillers has a negative impact on the elongation at break of the composites compared to virgin PP so that the viscoplastic properties of the composite are reduced. FIG. 11 shows that the PP AgGF 10 vol. % composition shows an improvement in elongation at break when compared to PP CNT 10 vol. % compositions. Thus, the carbon nanotubes composites do not display a viscoplastic yield anymore whereas the silver glass fiber composites conserve decent viscoplastic properties with an elongation at break above 10% (see FIG. 11) and a still existent elongation at yield of 5.1% (see FIG. 12).

Example 5—Other Polymers or Dispersing Agent

Composite materials have been produced using other polymers as component A, such as:
the polyethylene LD 0304, commercially available from TOTAL®, being a low-density polyethylene having an MFI of 4 g/10 min as determined by ISO1133 (190° C.–2.16 kg/10 min) and a density of 0.924 g/cm³ as determined by ISO1183 at 23° C.
the polystyrene 1160, commercially available from TOTAL®, being a crystal polystyrene having an MFI of 2.4 g/10 min as determined by ISO1133 (200° C.–5 kg/10 min).

Composite material has also been produced using ethylene bis stearamide as component C.

Figure 13:
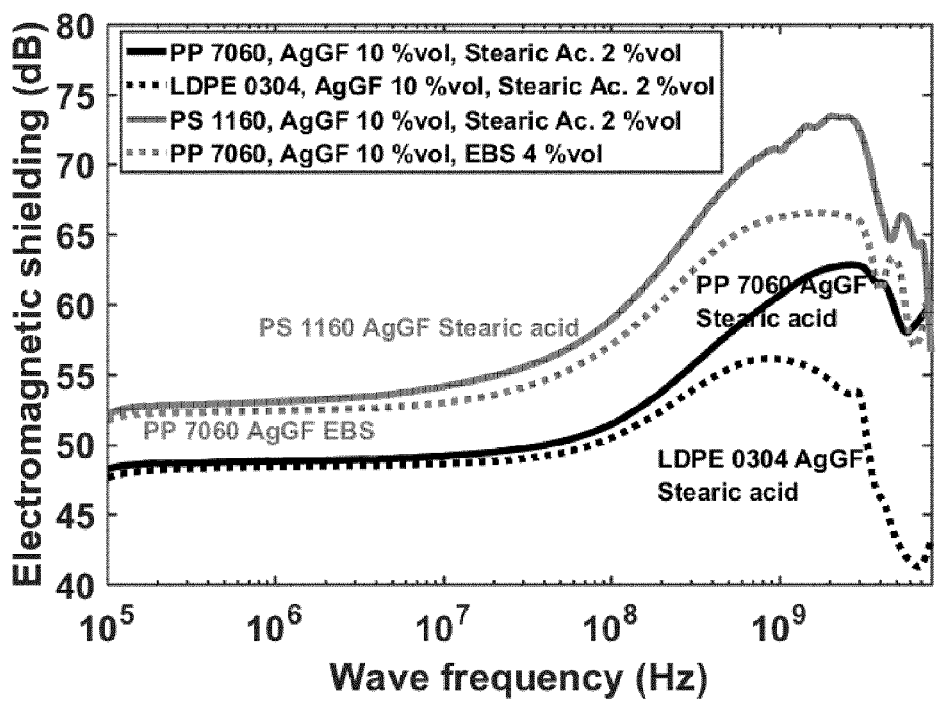
FIG. 13 is the shielding as a function of the incident wave frequency for composites containing 10 vol. % silver glass fiber. The PP 7060 matrix and stearic acid composite is compared with LDPE 0304 and PS 1160 matrices with stearic acid. The PP 7060 matrix and stearic acid composite is also compared with a composite containing ethylene bis stearamide (EBS) instead of stearic acid.

The results are provided in FIG. 13. No clear differences were observed on the shielding when the PP polymer matrix is changed for a PE or a PS matrix. Likewise, no clear difference is observed when stearic acid is replaced with ethylene bis stearamide (EBS) instead of stearic acid. While not being a fatty acid, EBS chemical structure is close to the one of stearic acid. 4 vol. % was introduced instead of 2 vol. %. It was expected that one molecule of EBS has the same effect on fillers as one of stearic acid, and EBS has approximately twice the molar mass and similar density.

Example 6—Shielding at Frequencies Up to 18 GHz

Figure 14:
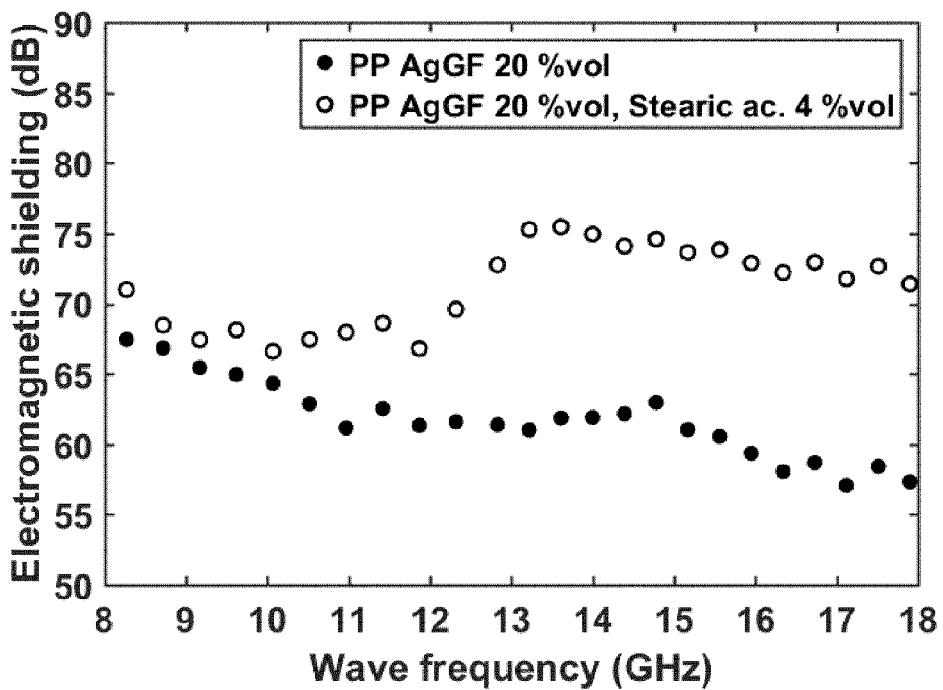
FIG. 14 is the shielding as a function of incident wave frequency in the high frequency 8-18 GHz range for PP 7060—silver glass fibers 15% vol with and without stearic acid. Thickness 1 mm.
Figure 15:
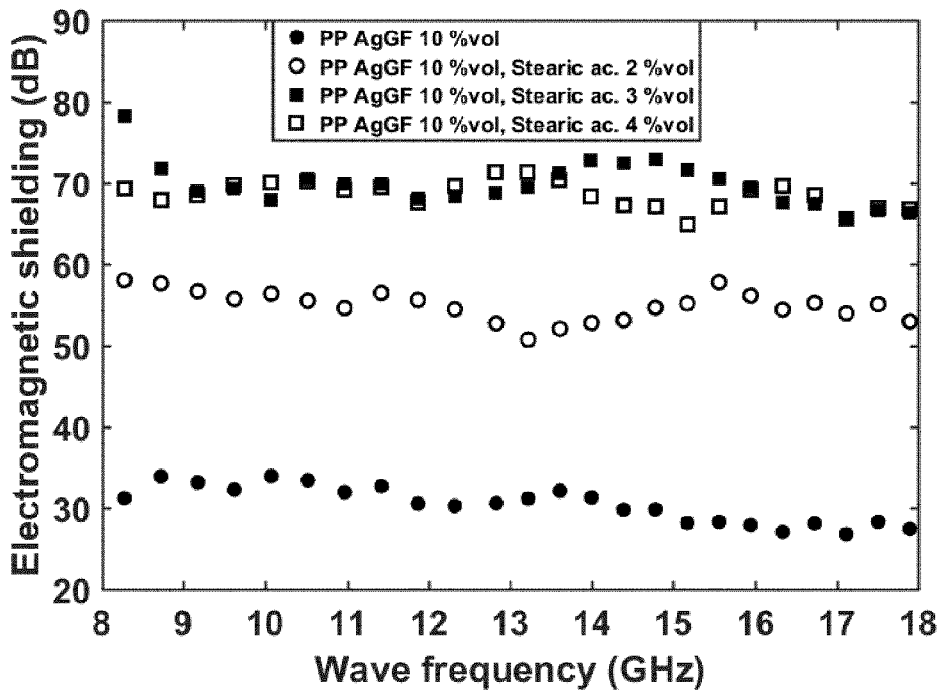
FIG. 15 is the shielding as a function of incident wave frequency in the high frequency 8-18 GHz range for PP 7060—silver glass fibers 10% vol and different stearic acid concentrations. Thickness 1 mm.
Figure 16:
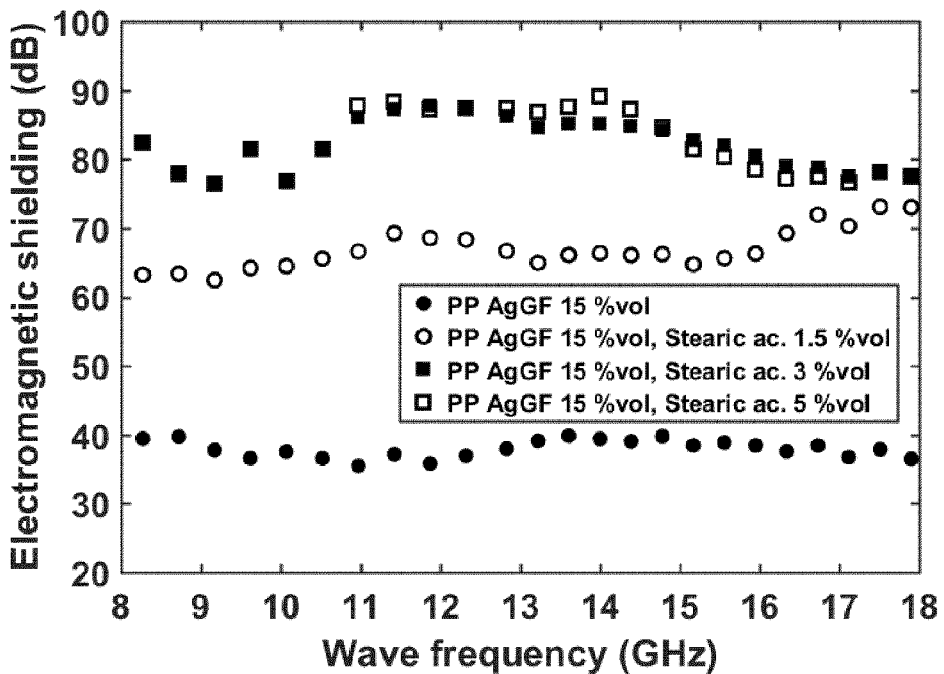
FIG. 16 is the shielding as a function of incident wave frequency in the high frequency 8-18 GHz range for PP 7060—silver glass fibers 15% vol and different stearic acid concentrations. Thickness 1 mm.

Measurement data made in waveguide in the frequency range 8-18 GHz are presented in FIGS. 14 to 16. From the results, it can be seen that the measurements in the high frequency 8-18 GHz range are consistent with the one made in the lower 0.1 MHz-8 GHz ones. Shielding increases with the concentration of silver glass fibers and the presence of stearic acid increases global shielding. Values of shielding superior to 70 dB are observed in presence of stearic acid for 10 vol. % of fibers (1 mm thickness). It was also observed an optimal amount of stearic acid for a maximized shielding value similar to the one of the lower frequency range. For 10 vol. % and 15 vol. % silver glass fibers concentration, this amount seems to be around 3 vol. %. However, in this higher frequency range, an excess of stearic acid seems to have less negative impact on shielding.

The invention claimed is:

1. Composite material suitable for use as EMI shielding material, characterized in that it comprises:
    a component A being a polymer resin being at least one amorphous polymer resin and/or at least one semi-crystalline polymer resin selected from polyethylene resin and/or polypropylene resin;
    from 22.0 to 50.0 wt. % of component B being at least one metal-coated particle based on the total weight of the composite material, wherein the at least one metal-coated particle of component B is metal-coated fibres with an average length of at least 150 μm, and wherein component B has a density of less than 4.0 g/cc; and
    from 1.0 to 5.0 wt. % of component C being one or more dispersants based on the total weight of the composite material; wherein one or more dispersants are selected from fatty acids, fatty acid derivatives, ethylene bis stearamide, functionalized waxes, maleic anhydride-grafted polymers and any mixture thereof;
wherein the blend of components A, B and C has a density ranging from 0.8 to 2.0 g/cc as determined by ISO 1183.

2. The composite material according to claim 1, characterized in that the at least one metal-coated particle of component B is or comprises metal-coated fibres with an average length of at least 100 μm; and/or component B has a density of less than 4.0 g/cc.

3. The composite material according to claim 1, characterized in that the at least one metal-coated particle of component B is or comprises metal-coated fibres wherein the fibres are selected from glass fibres, carbon fibres, polymer fibres, natural fibres and any mixture thereof.

4. The composite material according to claim 1, characterized in that the metal of the metal-coated particles of component B is selected from silver, copper, gold, aluminium, tungsten, zinc, cobalt, nickel, iron, or any mixture thereof; with preference, the metal is silver.

5. The composite material according to claim 1, characterized in that the composite material comprises from 22.0 to 50.0 wt. % of component B based on the total weight of the composite material; and/or from 1.5 to 3.0 wt. % of component C based on the total weight of the composite material.

6. The composite material according to claim 1, characterized in that the one or more dispersants are or comprise at least one fatty acid selected from stearic acid, palmitic acid, myristic acid, lauric acid, oleic acid, arachidic acid, erucic acid; behenic acid and any mixture thereof.

7. The composite material according to claim 1, characterized in that the one or more dispersants are or comprise ethylene bis stearamide.

8. The composite material according to claim 1, characterized in that component A:
    is present in the composite material at a content ranging from 35 to 80 wt. % based on the total weight of the composite material; and/or
    is selected from a virgin polymer resin, a post-consumer polymer resin and/or a blend of a virgin polymer resin and a post-consumer polymer resin; and/or
    comprises from 5 to 100 wt. % of post-consumer polymer resin based on the total weight of component A.

9. The composite material according to any claim 1, characterized in that component A is at least one semi-crystalline polymer resin and the composite material shows an elongation at break of at least 5% as determined according to ISO 527-1 and/or in that the component A is at least one semi-crystalline polymer resin selected from polypropylene resin and the composite material shows a young modulus of at least 500 MPa as determined by dynamic mechanical analysis according to ISO 6721-7.

10. The composite material according to claim 1, characterized in that component A is or comprises a semi-crystalline polymer resin being at least one polypropylene resin.

11. The composite material according to claim 1, characterized in that component A is or comprises a semi-crystalline polymer resin being at least one polyethylene resin.

12. The composite material according to any claim 1, characterized in that component A is or comprises at least one amorphous polymer resin selected from polystyrene, acrylonitrile-butadiene-styrene, polycarbonate, styrene-acrylonitrile, poly(methyl methacrylate), poly(vinyl chloride), polybutadiene, polybutylene terephthalate, poly(p-phenylene oxide), polysulfone, polyethersulfone, polyethylenimine, polyphenylsulfone, acrylonitrile styrene acrylate or any combination thereof.

13. The composite material according to claim 12, characterized in that component A is or comprises at least one amorphous polymer resin having an MFI at least 10 g/10 min as measured at 200° C. under a load of 5 kg according to IS01133 and/or is or comprises a post-consumer amorphous polymer resin.

14. A process to produce a composite material suitable for use as EMI shielding material of claim 1, the process is characterised in that it comprises a step of blending
   a component A being a polymer resin which is at least one amorphous polymer resins or at least one semi-crystalline polymer resin selected from polyethylene resin and/or polypropylene resin;
   from 22.0 to 50.0 wt. % of component B being at least one metal-coated particle based on the total weight of the composite material, wherein the at least one metal-coated particle of component B is metal-coated fibres with an average length of at least 150 μm, and wherein component B has a density of less than 4.0 g/c; and
   from 1.0 to 5.0 wt. % of component C being one or more dispersants based on the total weight of the composite material; wherein one or more dispersants are selected from fatty acids, fatty acid derivatives, ethylene bis stearamide, functionalized waxes, maleic anhydride-grafted polymers, and any mixture thereof;
   to form a composite material in which the blend of components A, B and C has a density ranging from 0.8 to 2.0 g/cc as determined according to ISO 1183.

15. An EMI shield article characterized in that it is made from a composite material according to claim 1.

* * * * *